(12) United States Patent
Swenson et al.

(10) Patent No.: US 11,874,344 B2
(45) Date of Patent: Jan. 16, 2024

(54) DYNAMICAL ISOLATION OF A CRYOGENIC PROCESSOR

(71) Applicant: D-WAVE SYSTEMS INC., Burnaby (CA)

(72) Inventors: Loren J. Swenson, San Jose, CA (US);
Andrew J. Berkley, Vancouver (CA);
Mark H. Volkmann, Burnaby (CA);
George E. G. Sterling, Vancouver (CA); Jed D. Whittaker, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 0 days.

(21) Appl. No.: 18/082,385

(22) Filed: Dec. 15, 2022

(65) Prior Publication Data
US 2023/0204691 A1 Jun. 29, 2023

Related U.S. Application Data

(63) Continuation of application No. 17/388,545, filed on Jul. 29, 2021, now Pat. No. 11,561,269, which is a
(Continued)

(51) Int. Cl.
*G01R 33/035* (2006.01)
*G06N 10/00* (2022.01)
*H10N 60/12* (2023.01)

(52) U.S. Cl.
CPC ......... *G01R 33/0354* (2013.01); *G06N 10/00* (2019.01); *H10N 60/12* (2023.02)

(58) Field of Classification Search
CPC ............ G01R 33/0354; G01R 33/0094; H01L 39/223; G06N 10/00; G06N 5/003
(Continued)

(56) References Cited

U.S. PATENT DOCUMENTS 2,832,897 A 4/1958 Buck
2,865,006 A 12/1958 Samuel
(Continued)

FOREIGN PATENT DOCUMENTS

CA 2058837 A1 7/1992
CA 2379144 A1 2/2001
(Continued)

OTHER PUBLICATIONS

Berkley, "A Josephson Junction Qubit", Dissertation University of Maryland, 2003.
(Continued)

*Primary Examiner* — Giovanni Astacio-Oquendo
(74) *Attorney, Agent, or Firm* — Cozen O'Connor

(57) ABSTRACT

A device is dynamically isolated via a broadband switch that includes a plurality of cascade elements in series, wherein each cascade element comprises a first set of SQUIDs in series, a matching capacitor, and a second set of SQUIDs in series. The broadband switch is set to a passing state via flux bias lines during programming and readout of the device and set to a suppression state during device's calculation to reduce operation errors at the device. A device is electrically isolated from high-frequencies via an unbiased broadband switch. A device is coupled to a tunable thermal bath that includes a broadband switch.

20 Claims, 13 Drawing Sheets

Related U.S. Application Data continuation of application No. 16/397,790, filed on Apr. 29, 2019, now Pat. No. 11,105,866.

(60) Provisional application No. 62/778,643, filed on Dec. 12, 2018, provisional application No. 62/680,824, filed on Jun. 5, 2018.

(58) Field of Classification Search
USPC .................................. 324/248, 244, 200
See application file for complete search history.

(56) References Cited

U.S. PATENT DOCUMENTS

| | | | |
|---|---|---|---|
| 3,200,368 A | 8/1965 | Stekly et al. | |
| 3,267,396 A | 8/1966 | James | |
| 3,380,004 A | 4/1968 | Hansen | |
| 3,753,168 A | 8/1973 | Schor | |
| 3,766,502 A | 10/1973 | Bronca et al. | |
| 3,783,417 A | 1/1974 | Osada et al. | |
| 4,028,714 A | 6/1977 | Henkels | |
| 4,239,010 A | 12/1980 | Amburn | |
| 4,342,013 A | 7/1982 | Kallman | |
| 4,453,144 A | 6/1984 | Tamura et al. | |
| 4,464,640 A | 8/1984 | Nishikawa et al. | |
| 4,707,184 A | 11/1987 | Hashiguchi et al. | |
| 4,731,611 A | 3/1988 | Mueller et al. | |
| 4,761,623 A | 8/1988 | Schneider | |
| 4,781,969 A | 11/1988 | Kobayashi et al. | |
| 4,797,596 A | 1/1989 | Tsuzurahara | |
| 4,943,792 A | 7/1990 | Srivastava et al. | |
| 4,947,118 A | 8/1990 | Fujimaki | |
| 4,952,896 A | 8/1990 | Dawson | |
| 5,083,101 A | 1/1992 | Frederick | |
| 5,146,191 A | 9/1992 | Mandai et al. | |
| 5,150,086 A | 9/1992 | Ito | |
| 5,173,660 A | 12/1992 | Marsden | |
| 5,227,365 A | 7/1993 | Van | |
| 5,307,068 A | 4/1994 | Hartemann | |
| 5,313,176 A | 5/1994 | Upadhyay | |
| 5,319,343 A | 6/1994 | Jeffries | |
| 5,392,012 A | 2/1995 | Iwata et al. | |
| 5,446,427 A | 8/1995 | Nakayama et al. | |
| 5,616,539 A | 4/1997 | Hey-Shipton et al. | |
| 5,618,777 A | 4/1997 | Hey-Shipton et al. | |
| 5,831,489 A | 11/1998 | Wire | |
| 5,869,846 A | 2/1999 | Higashino et al. | |
| 5,917,066 A | 6/1999 | Eisenmann et al. | |
| 5,936,458 A | 8/1999 | Rylov | |
| 5,937,263 A | 8/1999 | Eisenmann et al. | |
| 5,939,955 A | 8/1999 | Chen et al. | |
| 5,974,335 A | 10/1999 | Talisa et al. | |
| 6,026,311 A | 2/2000 | Willemsen et al. | |
| 6,094,110 A | 7/2000 | Reddy | |
| 6,347,237 B1 | 2/2002 | Eden et al. | |
| 6,686,811 B2 | 2/2004 | Hey-Shipton | |
| 6,825,748 B1 | 11/2004 | Ibata et al. | |
| 6,898,450 B2 | 5/2005 | Eden et al. | |
| 6,979,836 B2 | 12/2005 | Zagoskin et al. | |
| 7,145,415 B2 | 12/2006 | Sengupta et al. | |
| 7,164,331 B2 | 1/2007 | Reddy | |
| 7,335,909 B2 | 2/2008 | Amin et al. | |
| 7,456,702 B2 | 11/2008 | Keefe et al. | |
| 7,477,060 B2 | 1/2009 | Yu et al. | |
| 7,533,068 B2 | 5/2009 | Maassen et al. | |
| 7,619,437 B2 | 11/2009 | Thom et al. | |
| 7,624,088 B2 | 11/2009 | Johnson et al. | |
| 7,639,035 B2 | 12/2009 | Berkley | |
| 7,791,430 B2 | 9/2010 | Keefe et al. | |
| 7,800,395 B2 | 9/2010 | Johnson et al. | |
| 7,843,209 B2 | 11/2010 | Berkley | |
| 7,859,364 B2 | 12/2010 | Sakisaka et al. | |
| 7,876,248 B2 | 1/2011 | Berkley et al. | |
| 7,990,662 B2 | 8/2011 | Berkley et al. | |
| 8,008,991 B2 | 8/2011 | Tcaciuc et al. | |
| 8,073,808 B2 | 12/2011 | Rose | |
| 8,098,179 B2 | 1/2012 | Bunyk et al. | |
| 8,159,313 B2 | 4/2012 | Uchaykin | |
| 8,169,231 B2 | 5/2012 | Berkley | |
| 8,179,133 B1 * | 5/2012 | Kornev | G01R 33/0354 324/225 |
| 8,190,548 B2 | 5/2012 | Choi | |
| 8,195,596 B2 | 6/2012 | Rose et al. | |
| 8,228,688 B2 | 7/2012 | Uchaykin et al. | |
| 8,244,650 B2 | 8/2012 | Rose | |
| 8,247,799 B2 | 8/2012 | Bunyk et al. | |
| 8,279,022 B2 | 10/2012 | Thom et al. | |
| 8,315,678 B2 | 11/2012 | Uchaykin | |
| 8,346,325 B2 | 1/2013 | Thom et al. | |
| 8,421,053 B2 | 4/2013 | Bunyk et al. | |
| 8,436,354 B2 | 5/2013 | Aoki et al. | |
| 8,441,329 B2 | 5/2013 | Thom et al. | |
| 8,441,330 B2 | 5/2013 | Uchaykin | |
| 8,536,566 B2 | 9/2013 | Johansson et al. | |
| 8,604,669 B2 | 12/2013 | Hsieh et al. | |
| 8,611,974 B2 | 12/2013 | Maibaum et al. | |
| 8,670,807 B2 | 3/2014 | Rose et al. | |
| 8,738,105 B2 | 5/2014 | Berkley et al. | |
| 8,745,850 B2 | 6/2014 | Farinelli et al. | |
| 8,854,704 B2 | 10/2014 | Takahashi | |
| 9,015,215 B2 | 4/2015 | Berkley et al. | |
| 9,300,029 B2 | 3/2016 | Abraham et al. | |
| 9,495,644 B2 | 11/2016 | Chudak et al. | |
| 10,003,217 B2 | 6/2018 | Kuerschner et al. | |
| 10,528,886 B2 | 1/2020 | Boothby | |
| 10,535,013 B2 * | 1/2020 | Abdo | H03K 19/195 |
| 10,586,911 B1 * | 3/2020 | Sandberg | H10N 60/12 |
| 10,755,190 B2 | 8/2020 | Tcaciuc et al. | |
| 10,897,068 B2 | 1/2021 | Tcaciuc et al. | |
| 10,938,346 B2 | 3/2021 | Berkley et al. | |
| 11,105,866 B2 | 8/2021 | Swenson et al. | |
| 11,127,893 B2 | 9/2021 | Johnson et al. | |
| 11,617,272 B2 | 3/2023 | Neufeld | |
| 2001/0025012 A1 | 9/2001 | Tarutani et al. | |
| 2005/0007096 A1 | 1/2005 | Dimino et al. | |
| 2005/0104683 A1 | 5/2005 | Cortes et al. | |
| 2005/0184829 A1 | 8/2005 | Yoshimoto et al. | |
| 2007/0052441 A1 | 3/2007 | Taguchi et al. | |
| 2008/0176751 A1 | 7/2008 | Tcaciuc et al. | |
| 2008/0238531 A1 | 10/2008 | Harris | |
| 2008/0258849 A1 | 10/2008 | Keefe et al. | |
| 2008/0284545 A1 | 11/2008 | Keefe et al. | |
| 2009/0102580 A1 | 4/2009 | Uchaykin | |
| 2009/0122508 A1 | 5/2009 | Uchaykin et al. | |
| 2009/0146599 A1 | 6/2009 | Zhou et al. | |
| 2009/0168286 A1 | 7/2009 | Berkley et al. | |
| 2009/0241013 A1 | 9/2009 | Roetteler | |
| 2010/0157522 A1 | 6/2010 | Refai-Ahmed | |
| 2010/0157552 A1 | 6/2010 | Thom et al. | |
| 2011/0022820 A1 | 1/2011 | Bunyk et al. | |
| 2011/0152104 A1 | 6/2011 | Farinelli et al. | |
| 2011/0183853 A1 | 7/2011 | Thom et al. | |
| 2012/0088675 A1 | 4/2012 | Pires et al. | |
| 2012/0135867 A1 | 5/2012 | Thom et al. | |
| 2014/0137571 A1 | 5/2014 | Petroff et al. | |
| 2014/0326001 A1 | 11/2014 | Citver et al. | |
| 2015/0092465 A1 | 4/2015 | Herr et al. | |
| 2015/0263260 A1 | 9/2015 | Thom et al. | |
| 2015/0276827 A1 | 10/2015 | Sharma et al. | |
| 2016/0085616 A1 | 3/2016 | Berkley | |
| 2016/0112031 A1 | 4/2016 | Abraham et al. | |
| 2016/0267032 A1 | 9/2016 | Rigetti et al. | |
| 2017/0091648 A1 | 3/2017 | Abdo | |
| 2017/0146579 A1 | 5/2017 | Beaty et al. | |
| 2017/0178018 A1 | 6/2017 | Tcaciuc et al. | |
| 2017/0269146 A1 | 9/2017 | Regau | |
| 2017/0373044 A1 | 12/2017 | Das et al. | |
| 2018/0321339 A1 | 11/2018 | Yang et al. | |
| 2018/0336299 A1 | 11/2018 | Barzegar et al. | |
| 2019/0302194 A1 * | 10/2019 | Lemay | G01R 33/0011 |
| 2020/0050961 A1 | 2/2020 | Abdo | |
| 2020/0068722 A1 | 2/2020 | Neufeld | |
| 2020/0081075 A1 * | 3/2020 | Leese de Escobar | G01R 33/0094 |
| 2020/0092985 A1 | 3/2020 | Bruce et al. | |

(56) References Cited

U.S. PATENT DOCUMENTS

| | | | |
|---|---|---|---|
| 2020/0351007 A1 | 11/2020 | Raymer et al. | |
| 2021/0057631 A1 | 2/2021 | Swenson et al. | |
| 2021/0190885 A1 | 6/2021 | Swenson et al. | |
| 2021/0232364 A1 | 7/2021 | Swenson | |
| 2022/0215281 A1 | 7/2022 | Englund et al. | |
| 2023/0142878 A1* | 5/2023 | Yamaji | H10N 60/12 |
| | | | 324/248 |

FOREIGN PATENT DOCUMENTS

| | | |
|---|---|---|
| CN | 107924982 A | 4/2018 |
| DE | 4119880 A1 | 1/1993 |
| EP | 0148479 A2 | 7/1985 |
| EP | 0707349 A1 | 4/1996 |
| EP | 1622435 A1 | 2/2006 |
| JP | 2002374107 A | 12/2002 |
| JP | 2005216999 A | 8/2005 |
| WO | 2005093649 A1 | 10/2005 |
| WO | 2006043879 A1 | 4/2006 |
| WO | 2006066415 A1 | 6/2006 |
| WO | 2007085074 A1 | 8/2007 |
| WO | 2010028183 A2 | 3/2010 |
| WO | 2013190263 A1 | 12/2013 |
| WO | 2017055946 A1 | 4/2017 |
| WO | 2017074386 A1 | 5/2017 |
| WO | 2017115008 A1 | 7/2017 |
| WO | 2018055472 A1 | 3/2018 |
| WO | 2018106942 A1 | 6/2018 |
| WO | 2022140165 A1 | 6/2022 |

OTHER PUBLICATIONS

Bladh et al., "Comparison of Cryogenic Filters for use in Single Electronics Experiments," Review of Scientific Instruments 74(3):1323-1327, 2003.

Bordier et al., "Superconducting Coplanar Switch and Phase Shifter for CMB Applications," J Low Temp Phys, 2016, 7 pages.

Chapman et al., "General Purpose Multiplexing Device for Cryogenic Microwave Systems," arXiv:1603.02716v2 [quant-ph] May 31, 2016, 10 pages.

Chapman et al., "Widely Tunable On-Chip Microwave Circulator for Superconducting Quantum Circuits," Physical Review, vol. 7. 2017, 16 pages.

Chapman, et al. "Design of an On-Chip Superconducting Microwave Circulator with Octave Bandwidth" arXiv:1809.08747v1. Sep. 24, 2018.

Dickson et al., "Thermally Assisted Quantum Annealing of a 16-Qubit Problem," Nature Communications, 2013, 6 pages.

Douglas, "Magnetic Field Dependence of the Superconducting Energy Gap", Physical Review Letters 6(7): 346-348, Apr. 1, 1961.

English translation of Office Action dated Sep. 30, 2022, in JP App No. 2021-149531, 10 pages.

Final Office Action Issued in U.S. Appl. No. 16/562,984, dated Jan. 31, 2023, 18 pages.

First Office Action dated Oct. 14, 2022 for CN 2020-519439, English translation, 4 pages.

First Office Action issued in Chinese No. 2017800268619 with English translation, dated Sep. 6, 2022, 12 pages.

Fukushima, A. et al., "Attenuation of Microwave Filters for Single-Electron Tunneling Experiments," IEEE Transactions on Instrumentation and Measurement, 46(2):289-293, 1997.

Il'ichev et al., "Continuous Monitoring of Rabi Oscillations in a Josephson Flux Qubit," arXiv:cond-mat/0303433v1, Mar. 20, 2003.

J. Aumentado, 2020, "Superconducting Parametric Amplifiers", IEEE Microwave Magazine 20(4), Dec. 2020, 18 pages., 21(8), p. 45-59, Jul. 7, 2020.

Jin et al., "Distributed microwave damping filters for superconducting quantum interference devices", Appl. Phys. Lett. 70(16):2186-2188, Apr. 21, 1997.

Johnson et al., "Scalable Control System for a Superconducting Adiabatic Quantum Optimization Processor," ArXiv:0907.3757v1. Jul. 22, 2009. [online] Available. chrome-extension://efaidnbmnnnibpcajpcglclefindmkaj/https://arxiv.org/pdf/0907.3757v1.pdf.

Jones et al., "Highly Controllable Qubit-Bath Coupling Based on a Sequence of Resonators," arXiv:1304.4829v2 [cond-mat.mes-hall] Sep. 27, 2013, 11 pages.

Jones et al., "Tunable electromagnetic Environment for Superconducting Quantum Bits," arXiv:1320.3824v5 [cond-mat.mes-hall] Jun. 13, 2013, 11 pages.

Kerckhoff, et al.,"On-Chip Superconducting Microwave Circulator from Synthetic Rotation", arXiv:1502.06041v1, Feb. 21, 2015.

Lee et al., "Investigation of the Dependences of the Attenuation Properties of Cryogenic Metal-Powder Filters on the Preparation Method", Journal of Korean Physical Society 72(8): 966-971, Apr. 2018.

Lee et al., "Study on the fabrication of low-pass metal powder filters for use at cryogenic temperatures", arXiv:1605.07597, May 2016.

Lukashenko et al., "Improved powder filters for qubit measurements", Review of Scientific Instruments 79(014701): 1-4, 2008.

Mueller, et al., "Printed Circuit Board Metal Powder Filters for Low Electron Temperatures", ArXiv:1304.3306, Apr. 11, 2013, 13 pages.

Naaman, O. et al., "On-Chip Josephson Junction Microwave Switch," arXiv:1512.01484v1 [cond-mat.supr-con] Dec. 4, 2015, 10 pages.

Non-Final Office Action dated Jul. 28, 2022 in U.S. Appl. No. 16/562,984 (17 pages).

Notice of Allowance for U.S. Appl. No. 17/388,545, dated Sep. 27, 2022, 9 pages.

Notice of Reasons for Rejection dated Jun. 27, 2023, for Japanese Application No. 2022-564258, 6 pages.

Partanen et al., "Flux-tunable heat sink for quantum electric circuits", ArXiv:1712.10256, Dec. 29, 2017.

Pechal et al., "Superconducting Switch for Fast On-Chip Routing of Quantum Microwave Fields," arXiv: 1606.01031v1 [quant-ph] Jun. 3, 2016, 8 pages.

Poulin et al., "A Superconducting Microwave Switch," IEEE Transactions on Applied Superconductivity 5(2): 3046-3048, 1995.

Powell et al., "Thermal Conductivity of Metals and Alloys at Low Temperatures", National Bureau of Standards Circular 556, Sep. 1, 1954.

Santavicca et al., "Impedance-Matched Low-Pass Stripline Filters," arXiv:0802.1343 [physics.ins-det] 2008, 9 pages.

Shabani et al., "Artificial Quantum Thermal Bath: Engineering Temperature for a Many-Body Quantum System," arXiv:1510.04354v2 [quant-ph] Nov. 4, 2016, 10 pages.

Swenson et al., "A Broad Superconducting SQUID Switch", Aug. 23, 2016.

Swenson, "Isolating the D-Wave Quantum Processor from Thermal Photons above vc=kb0.003/h=62.5 Mhz", 2016.

Thaker et al., "Quantum Memory Hierarchies: Efficient Designs to Match Available Parallelism in Quantum Computing," arXiv:quant-ph/0604070v1, 12 pages, Apr. 10, 2006.

Tuorila et al., "Efficient Protocol for Qubit Initialization with a Tunable Environment," arXiv:1612.04160v1 [cond-mat.mes-hall] Dec. 13, 2016, 17 pages.

Van Zant, "Microchip Fabrication", Fourth Edition, McGraw-Hill, New York, 2000. (book details provided).

Vlasov, "Von Neumann Quantum Processors," arXiv:quant-ph/0311196v1, pp. 1-8, Nov. 27, 2003.

Watanabe et al., "Resonance-Free Low-Pass Filters for the AC Josephson Voltage Standard," IEEE Transactions on Applied Superconductivity 16(1):49-53, Mar. 2006.

Whittaker, J.D. et al., "A Frequency and Sensitivity Tunable Microresonator Array for High-Speed Quantum Processor Readout," arXiv:1509.05811v2 [quant-ph], Apr. 22, 2016, 8 pages.

Williams, "Explorations in Quantum Computing", Chapter 11, "How to Make a Quantum Computer," pp. 241-265, 1998.

Wollack et al., "Impedance Matched Absorptive Thermal Blocking Filters," arXiv:1403.2909v1 [astro-ph.IM] Mar. 12, 2014, 5 pages.

Yeap, K.H. et al., "Attenuation in Superconducting Circular Waveguides," Advanced Electromagnetics vol. 5, No. 2, Sep. 2016, 5 pages.

(56) References Cited

OTHER PUBLICATIONS

Zorin, "The thermocoax cable as the microwave frequency filter for single electron circuits", Rev. Sci. Instrum. 66(8): 4296-4300, Aug. 1995.

Blatter, et al., "Design aspects of superconducting-phase quantum bits," Physical Review B 63: 174511-1-174511-9, 2001.

Danilin, et al., "Engineering the microwave to infrared noise photon flux for superconducting quantum\ systems", EPJ Quantum Technology, (2022) 9:1, 22 pages.

Fang, et al., "Development of Hardware for Scaling Up Superconducting Qubits and Simulation of Quantum Chaos", University of California, Santa Barbara, Bachelor's Honors Thesis,, Jun. 12, 2015, 56 pages.

Likharev, et al., "RSFQ logic/memory family: a new Josephson-junction technology for sub-terahertz-clock-frequency digital systems"; IEEE Transactions on Applied Superconductivity; vol. 1, No. 1; Mar. 1991.

Makhlin, et al., "Quantum-state engineering with Josephson-junction devices," arXIv:cond-mat/0011269v1, Nov. 15, 2000, Reviews of Modern Physics 73(2):357-400, Apr. 2001.

Milliken, et al. "50 $\Omega$ characteristic impedance low-pass metal powder filters," Review of Scientific Instruments 78 (2):024701, 2007, 5 pages.

Norris, "Improving Infrared-Blocking Microwave Filters", Semester Report, Oct. 2, 2017, 114 pages.

\* cited by examiner

DYNAMICAL ISOLATION OF A CRYOGENIC PROCESSOR

FIELD

This disclosure generally relates to dynamically isolating a device, such as a superconducting processor.

BACKGROUND

It is generally desirable for Input/Output (IO) lines of analog processors, for example quantum processors, to provide sufficient bandwidth for high-speed processor operations while at the same time limiting the introduction of noise. A particular source of noise that can interfere with the operation of an analog processor is the electrical coupling of the IO lines to the environment external to the analog processor. Blackbody radiation is especially difficult to reduce or eliminate. A dissipative source coupled to processor IO lines can emit photons which can propagate along the IO lines toward the processor. This radiation can interfere with the operation of the processor and be the cause of errors during operation, such as calculation errors. This phenomenon can be particularly evident for processors that operate at low or cryogenic temperatures.

In the following description and appended claims the term "operation cycle of a processor" means the acts performed by—or on the processor comprising, but not limited to, programming an instruction, calculations and/or computation, and readout. Programming an instruction may include loading registers or setting logic gates for classical and gate-model processors, respectively.

In a low temperature environment, the programming and readout portion of an operation cycle can usually tolerate higher level of noise than the calculating portion of an operation cycle. In the case of a quantum processor, for example, during programming and readout, the device energy barriers are kept high and are therefore less susceptible to noise due to a high flux of photons.

BRIEF SUMMARY

Thus, there is a general desire for systems and methods to reduce the noise caused by blackbody radiation with dynamic elements that isolate a processor only during the calculation portion of the operating cycle with a switching speed that does not increase the time of an operation cycle of the processor.

The foregoing examples of the related art and limitations related thereto are intended to be illustrative and not exclusive. Other limitations of the related art will become apparent to those of skill in the art upon a reading of the specification and a study of the drawings.

A switch for dynamically isolating a device comprises a plurality of cascade elements superconductingly electrically communicatively coupled in series. Each cascade element of the plurality of cascade elements comprises a respective first plurality of N Superconducting Quantum Interference Devices (SQUIDs) superconductingly electrically communicatively coupled in series in a first arm, a respective matching capacitor, and a respective second plurality of M SQUIDs superconductingly electrically communicatively coupled in series in a second arm, opposite the first arm with respect to the matching capacitor. Each SQUID of the first and second plurality of SQUIDs comprises at least one Josephson Junction.

The total number of SQUIDS N in the first plurality of N SQUIDS may be equal to the total number of SQUIDS M in the second plurality of M SQUIDS. The switch and the device may operate superconductively at cryogenic temperatures. The switch may further include a flux bias line. The switch may further comprise at least one filtering element along the flux bias line, the filtering element operable to cause the switch to operate at an operating speed. The filtering element may take the form of a passive filtering element, inductive choke or kinetic inductor.

A method for initializing a switch is described. The switch may be electrically coupled to a device. The switch comprises a plurality of cascade elements in series, each cascade element comprising a respective first plurality of N Superconducting Quantum Interference Devices (SQUIDs) superconductingly electrically communicatively coupled in series in a first arm, each SQUID of the first plurality of SQUIDs comprising at least one Josephson Junction, a respective matching capacitor and a respective second plurality of M SQUIDs superconductingly electrically communicatively coupled in series in a second arm, opposite the first arm with respect to the matching capacitor, each SQUID of the second plurality of SQUIDs comprising at least one Josephson Junction. The method may be summarized as comprising: determining an electrical operating band of the device; isolating the electrical operating band of the device; determining a power handling capacity of a passing state of the device; determining a power handling capacity of a suppressed state of the device; determining a degree of precision to which a flux bias of the first and second set of SQUIDs can be controlled; and modulating the flux bias to set the switch to a passing state.

The total number of SQUIDS N in the first plurality of N SQUIDS may be equal to the total number of SQUIDS M in the second plurality of M SQUIDS. The device may be a superconducting processor, a quantum processor or a gate-model quantum processor. The method may further comprise cooling the switch and the device to cryogenic temperatures. The method may include isolating the electrical operating band of the device with passive components. Passive components may be selected from a group comprising discrete and continuous filters, discrete and continuous powder filters, lossy transmission lines and attenuators.

The method may further comprise using the determined power handling capacity of a passive state of the device to set the critical current $I\_c$ of each SQUID in the first and second plurality of SQUIDs. The method may further comprise using the determined power handling capacity of a suppressed state of the device to set the degree to which each SQUID in the first and second plurality of SQUIDs can be suppressed.

A method for dynamically isolating a superconducting processor is described. The superconducting processor may be electrically coupled to a switch. The switch may include a flux bias line and a plurality of cascade elements in series, each cascade element comprising a respective first plurality of N Superconducting Quantum Interference Devices (SQUIDs) superconductingly electrically communicatively coupled in series in a first arm, each SQUID of the first plurality of SQUIDs comprising at least one Josephson Junction, a respective matching capacitor and a respective second plurality of M SQUIDs superconductingly electrically communicatively coupled in series in a second arm, opposite the first arm with respect to the matching capacitor, each SQUID of the second plurality of SQUIDs comprising at least one Josephson Junction. The method may be summarized as comprising: modulating the bias line to set the switch to a passing state; sending a signal to the superconducting processor; modulating the bias line to set the switch to a suppressed state; causing the superconducting processor to perform a calculation; modulating the bias line to set the switch to a passing state; and reading out an output from the superconducting processor.

The total number of SQUIDS N in the first plurality of N SQUIDS may be equal to the total number of SQUIDS M in the second plurality of M SQUIDS. The superconducting processor may be a quantum processor or a gate-model quantum processor. The superconducting processor may receive signals via microwave control lines that may not be continuously applied The method further comprises isolating the superconducting processor via at least one filtering element along the flux bias line, the filtering element causing the switch to operate at an operating speed. The filtering element may take the form of a passive filtering element, inductive choke or kinetic inductor.

A system may be summarized as including: a first device; a second device; and at least one switch. The at least one switch is electrically coupled to the first device via a flux bias line and electrically coupled to the second device, the at least one switch comprises a plurality of cascade elements in series, each cascade element comprises a respective first plurality of N Superconducting Quantum Interference Devices (SQUIDs) superconductingly electrically communicatively coupled in series in a first arm, a respective matching capacitor and a respective second plurality of M SQUIDs superconductingly electrically communicatively coupled in series in a second arm, opposite the first arm with respect to the matching capacitor. Each SQUID of the first and the second plurality of SQUIDs comprises at least one Josephson Junction. The first device is operable to: modulate the bias line to set the switch to a passing state; send a signal to the second device; modulate the bias line to set the switch to a suppressed state; cause the second device to perform an operation; modulate the bias line to set the switch to a passing state; and read out the second device.

The total number of SQUIDS N in the first plurality of N SQUIDS may be equal the total number of SQUIDS M in the second plurality of M SQUIDS. The second device is a superconducting processor. The superconducting processor may be a quantum processor or a gate-model quantum processor. The switch and the second device may operate superconductively at cryogenic temperatures. The switch may be electrically connected to the second device via microwave control signals. The microwave control signals may not be continuously applied.

The system may further comprise at least one filtering element along the flux bias line, the filtering element operable to cause the switch to operate at an operating speed. The filtering element may take the form of a passive filtering element, an inductive choke or kinetic inductor.

A system may be summarized as including: a tunable thermal bath; and a processor. The processor is dynamically coupled to the tunable thermal bath.

The tunable thermal bath may include: a variable temperature resistor; and a switch. The switch is electrically connected in series with the variable temperature resistor. The switch comprises a plurality of cascade elements superconductingly electrically communicatively coupled in series, each cascade element of the plurality of cascade elements comprises a respective first plurality of N Superconducting Quantum Interference Devices (SQUIDs) superconductingly electrically communicatively coupled in series in a first arm, a respective matching capacitor, and a respective second plurality of M SQUIDs superconductingly electrically communicatively coupled in series in a second arm, opposite the first arm with respect to the matching capacitor. Each squid in the first and second plurality of SQUIDs comprises at least one Josephson Junction.

The system may further comprise a low-pass filter, electrically connected in series with the switch. The switch is operable to dynamically isolate the processor from the thermal bath. The processor may be a quantum processor, including a superconducting quantum processor. The low-pass filter may be a variable low-pass filter.

The system may further comprise a transmission line, the transmission line providing electrical coupling between the tunable thermal bath and the processor. The electrical coupling may be a tunable coupling. The electrical coupling may be one of: capacitive coupling, inductive coupling, and resonator-based coupling.

The system may further comprise a SINIS refrigeration system for tuning the temperature of the variable thermal resistor.

A method for hybrid thermal-quantum annealing a processor system is described. The processor system may include a tunable thermal bath, and a quantum processor, the quantum processor comprising a plurality of superconducting qubits and dynamically coupled to the tunable thermal bath. The method may be summarized as comprising: tuning the tunable thermal bath to an initial temperature T; causing the quantum processor to be electrically coupled to the tunable thermal bath; programming the quantum processor with a problem Hamiltonian; and causing the quantum processor to start evolving.

The method may further comprise varying the initial temperature T via the tunable thermal bath during the evolution of the quantum processor.

The tunable thermal bath comprises a variable temperature resistor, and a switch, electrically connected in series with the variable temperature resistor, the switch comprising a plurality of cascade elements superconductingly electrically communicatively coupled in series, each cascade element of the plurality of cascade elements comprising a respective first plurality of N Superconducting Quantum Interference Devices (SQUIDs) superconductingly electrically communicatively coupled in series in a first arm, a respective matching capacitor, and a respective second plurality of M SQUIDs superconductingly electrically communicatively coupled in series in a second arm, opposite the first arm with respect to the matching capacitor, and a low-pass filter, electrically connected in series with the switch. Each squid in the first and second plurality of SQUIDs comprises at least one Josephson Junction.

Coupling the quantum processor to the tunable thermal bath includes causing the switch to be set to a passing state by modulating a flux bias line electrically coupled to the switch.

The quantum processor may be caused to start evolving backwards.

The method may further comprise iteratively: causing the quantum processor to be isolated from the tunable thermal bath; tune the temperature of the tunable thermal bath to a temperature $T_i$; causing the quantum processor to be coupled to the tunable thermal bath; and causing the processor to start evolving.

Causing the quantum processor to be isolated from the tunable bath includes causing the switch to be set to a suppressed state by modulating a flux bias line electrically coupled to the switch.

A method for calibrating a processor system is described. The processor system may include a tunable thermal bath, and a quantum processor, the quantum processor comprising a plurality of superconducting qubits and dynamically coupled to the tunable thermal bath. The method may be summarized as comprising: tuning the tunable thermal bath to a temperature T; causing the quantum processor to be coupled to the tunable thermal bath; and analyzing the effects of temperature T on the superconducting qubits.

Analyzing the effects of temperature T on the superconducting qubits includes one of: studying spin-bath effects and studying noise features that are depended on a temperature of a phonon bath that is different from temperature T.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
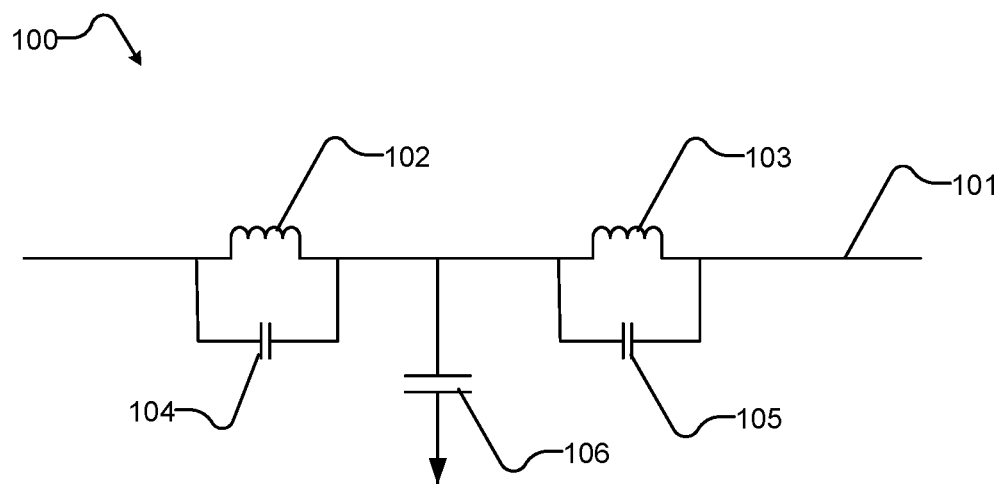
FIG. 1 is a simplified schematic diagram of an example implementation of a cascade section according to the present disclosure.

In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

It can be generally desirable for Input/Output (IO) lines of analog processors, for example quantum processors, to provide sufficient bandwidth for high-speed processor operations while at the same time limiting the degree of coupling to an external environment so as to reduce the introduction of blackbody radiation to the processor. When the analog processor is a quantum processor, electromagnetic radiation with energy hv exceeding the qubit thermal energy $\sim k_B T$, where $k_B$ is the Boltzmann constant and T is the operating temperature of the processor, has the potential to excite qubits out of a ground state. This excitation can lead to processor errors.

A common approach to reduce blackbody radiation is to employ passive elements such as filters, attenuators, current dividers and/or lossy transmission lines. However, these elements do not have the ability to change the isolation level of the processor in a time-dependent fashion and are usually designed to provide the necessary isolation at all times. When used for processor isolation such passive elements necessarily dissipate a large amount of energy as they are constantly filtering radiation. When the processor is in a cryogenic environment, such energy dissipation can cause cryostat heating and additional radiation emission.

Other methods can provide time-dependent processor isolation, such as placing high-speed, low-loss switches at cryogenic temperatures. Such switches may be used to isolate a processor by allowing signals to access room-temperature electronics. During the calculation portion of the operation cycle of a processor the switch may be closed or turned to a matched resistive load at low temperature to isolate the processor, thus limiting black body radiation. However, a time delay is required after switching to allow any energetic photons present in the cryogenic environment to be absorbed and thermalized. The scale of this delay may depend on the ability of the photons to find absorbing material and on the thermalization time of the components of the processor. The delay may negatively impact the speed of the operating cycle of the processor.

Many pathways exist for propagation of high-frequency radiation into a processor sample space (the physical space occupied by, and in the vicinity of, the processor). In particular, a transmission line (for example, a twisted pair or a coaxial cable) can cause radiation to propagate into the processor sample space. An example of a pathway that can have a direct impact on processor error are readout lines (for example, microwave coaxial lines used for readout of superconducting devices in the processor).

In the case of coaxial lines, it can be advantageous to filter radiation with frequencies that lie outside a desired signal bandwidth, used for example for processor manipulation or readout. Filtering can help to reduce the introduction of calculation errors at the processor. In one implementation of a processor, for example a quantum processor, the readout bandwidth may be 4-8 GHz. It can be advantageous for the readout lines to filter radiation with frequencies that lie outside the 4 GHz-8 GHz bandwidth during the calculation portion of the operation cycle of the processor. While a filter, or a set of filters, such as passive filters, can efficiently reduce or block radiation with frequencies that lie outside the readout bandwidth, the readout bandwidth itself can be a pathway for radiation to propagate to the processor during the calculation portion of the operation cycle of the processor. Therefore, it can be desirable to employ a broadband switch that allows the readout bandwidth, for example 4 GHz-8 GHz, to be accessed during readout and/or at other times when signals are being transmitted to the processor or are being received from the processor. A broadband switch can allow the processor to be isolated during the calculation portion of the operation cycle. Similarly, it can be desirable to employ a broadband switch that allows the programming bandwidth to be accessed during the programming portion of the operation cycle of the processor, and allows the processor to be isolated during the calculation portion of the operation cycle.

Examples of such dynamic switches are described in U.S. Patent Publication No. US20170178018A1, Naaman et al. (https://arxiv.org/abs/1512.01484), Chapman et al. (https://arxiv.org/abs/1603.02716), Chapman et al. (https://arxiv.org/abs/1707.04565), Pechal et al. (https://arxiv.org/abs/1606.01031), and Bordier et al. (2016). Superconducting Coplanar Switch and Phase Shifter for CMB Applications. Journal of Low Temperature Physics. 184. 10.1007/510909-016-1567-z.

The following systems, methods and apparatus describe techniques for broadband dynamic isolation of a device, for example a superconducting processor, using a broadband switch.

A broadband switch providing broadband isolation of a device can be in a passing state or a suppression state. When the broadband switch is in a passing state, it allows an electrical signal to propagate to the processor. It is advantageous that the broadband switch allows the electrical signal to pass essentially undistorted at a signal power up to at least the power of the programming and readout operations. This allows for a signal to pass through the broadband switch without causing readout or programming errors.

For example, if the total power of the readout signal is approximately −80 dBm or 10 pW, it is advantageous for the broadband switch to allow the signal to pass essentially undistorted up to at least −80 dBm, when in the passing state.

In addition, when the broadband switch is in a suppression state, thus isolating the processor, it is desirable that the broadband switch does not pass nor emit photons with energy exceeding $k_B T$. In at least one implementation, the broadband switch is placed at the lowest temperature close to the processor, for example at cryogenic temperatures, in the sample space. When the broadband switch is placed at cryogenic temperatures, it is also desirable that the broadband switch not statically dissipate the control signal to reduce any impact on the processor temperature. Similarly, it is desirable that the broadband switch not statically dissipate the readout signal. For example, when the total power of the readout signal is 10 pW, it is desirable for the broadband switch to limit dissipation to approximately 0.1 pW. Alternatively, if the broadband switch dissipates a small amount of photons, an additional filter, such as a high-pass filter, may be placed along transmission lines between the broadband switch and the processor to attenuate the noise caused by such photons.

It is desirable that the broadband switch has a low insertion loss to limit or avoid signal corruption. The allowable dissipation of the broadband switch in the passing state may be inferred from the previous considerations on the broadband switch power handling and dissipation. For example, if the expected upper bound for the readout lines is 10 pW, and the broadband switch heating is in the order of 0.1 pW, it is desirable that the dissipation is less than $$10\log_{10}\left(\frac{10-0.1}{10}\right)=0.04\text{ dB}.$$

Signal reflection can also contribute to insertion loss. A cause of signal reflection can be impedance mismatch in the cabling used between room temperature electronics and elements of the system at the operating temperature of the processor. It can be advantageous to design the broadband switch to include both dissipation and signal reflection as contributions to the insertion loss of the switch.

In the suppression state, the broadband switch can limit processor calculation errors due to high-frequency excitations below a defined threshold level. Placing an active switch according to the present systems, methods and apparatus at the operating temperature of the processor can significantly increase isolation of the processor during the calculation portion of the operation cycle.

A possible shortcoming can be that an active switch, even if providing appropriate isolation, can negatively impact the performance of a processor if the switch speed is slower compared to the operation cycles of the processor. It can be desirable for the broadband switch to be able to change states between the passing state and the suppression state faster than the operation cycle of the processor.

A control line can be electrically coupled to the broadband switch for the broadband switch to modulate between the passing and the suppression state. However, it is desirable for this control line not to introduce an additional pathway for radiation to reach the processor during the suppression state. In at least one implementation, the control line is filtered to allow only the radiation bandwidth necessary to achieve the desired switching times.

For a processor operating at cryogenic temperatures, such as a quantum processor, it may be advantageous to employ a superconducting broadband switch that reflects incident radiation in the suppression state by presenting a large mismatched impedance. An example of a non-dissipative tuning element that can be integrated into cryogenic IO systems is a SQUID. A SQUID comprising one or two Josephson junctions can be added to the transmission line of a superconducting processor to enable tuning between two impedance states. In case neither of the two impedance states is matched to the environment of the superconducting processor, it may be advantageous to add a matching shunting capacitor to provide an additional degree of freedom tuning impedance. A single SQUID and matching capacitor can be used as a broadband switch. Different implementations of SQUIDs with one and two Josephson Junctions (RF-SQUIDs and DC-SQUIDs, respectively) are described in greater details in U.S. Pat. Nos. 6,627,916 and 9,727,823.

Figure 2:
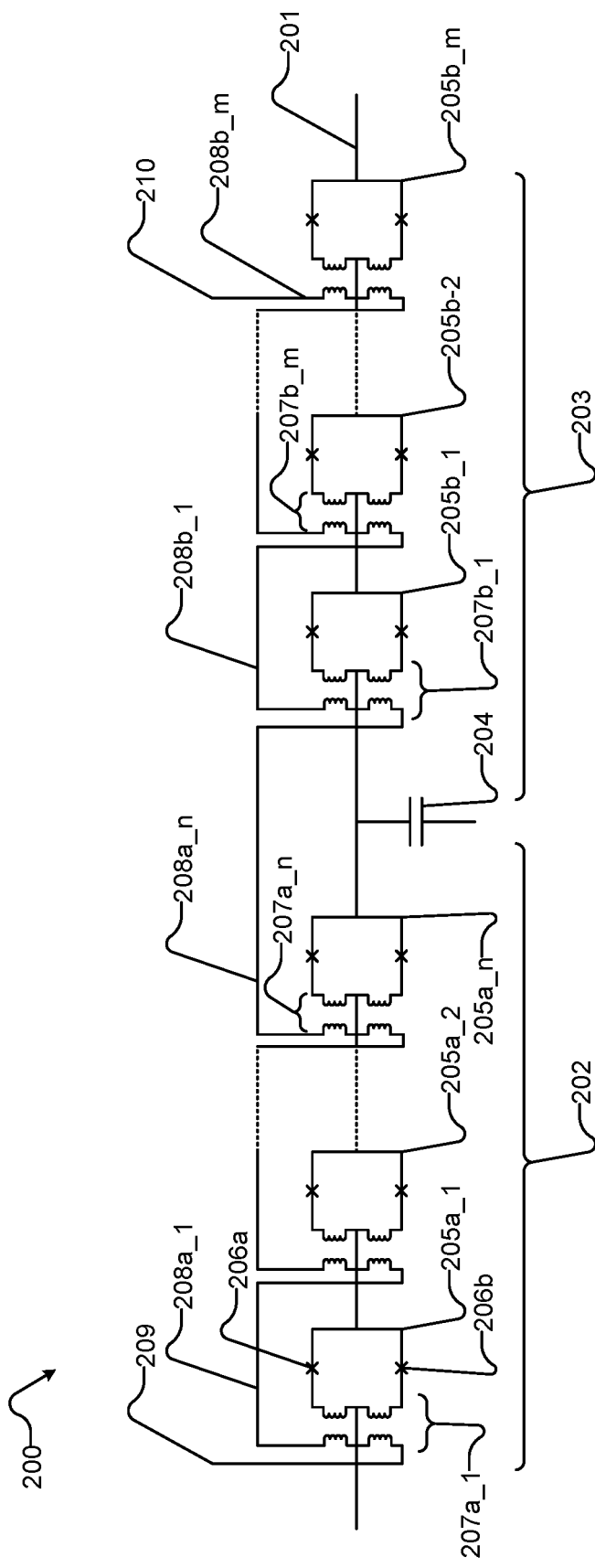
FIG. 2 is a schematic diagram of an example implementation of a single cascade element according to the present disclosure.
Figure 3:
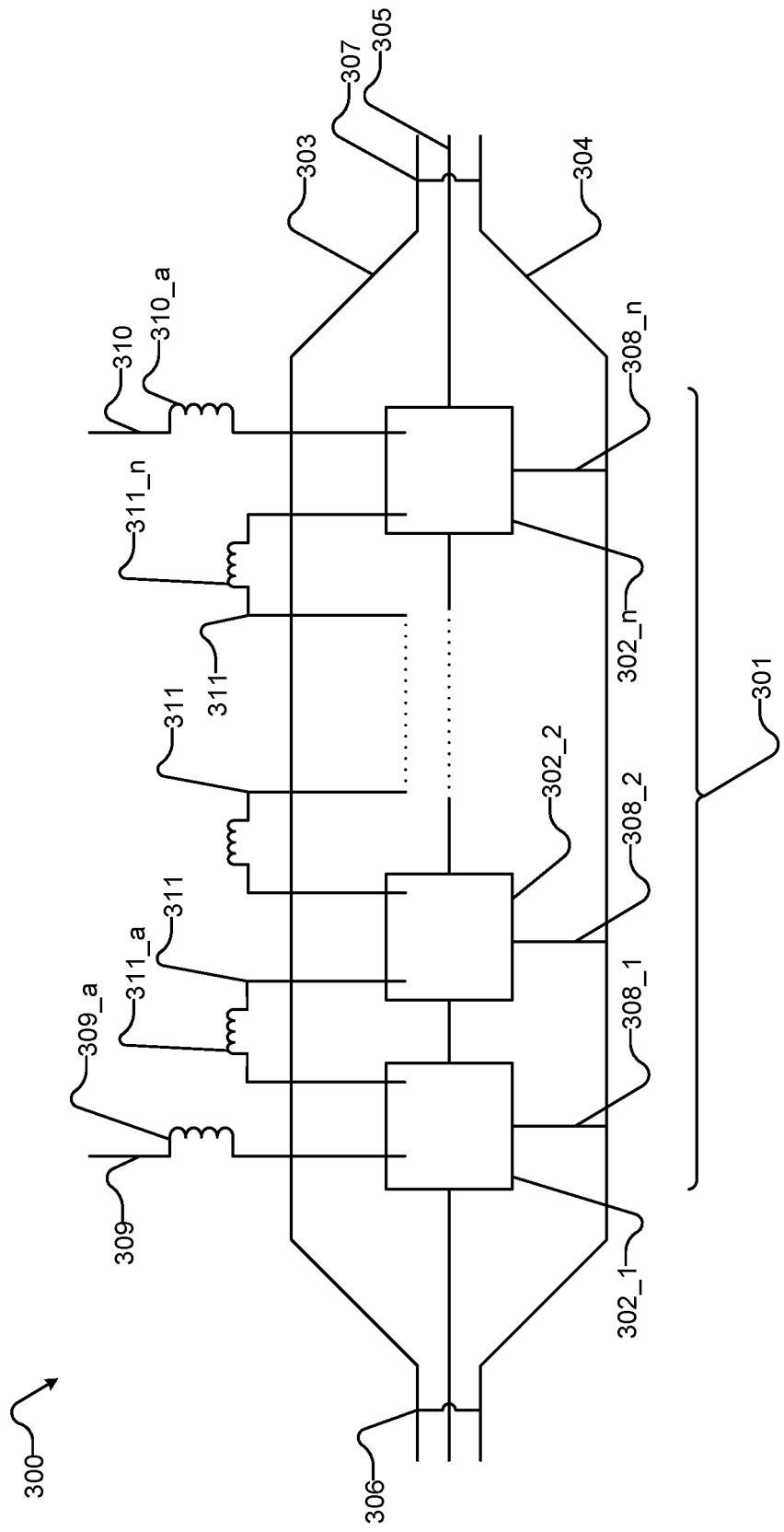
FIG. 3 is a schematic diagram of an example implementation of a transmission line layout with N cascade elements according to the present disclosure.

To increase suppression, a cascade of SQUIDs and matching capacitors can be used as a broadband switch, as shown in FIGS. 1 through 3.

FIG. 1 is a simplified schematic diagram of an example implementation of a cascade section 100 according to the present systems, methods and apparatus. Cascade section 100 may be used as one of a plurality of cascade of elements as part of a broadband switch for dynamically isolating a device, such as a superconducting processor.

Cascade section 100 comprises a transmission line 101. A first end of transmission line 101 (e.g., the right-hand side in the plane of the page of FIG. 1) is electrically connected to a device (e.g., a processor, not shown in FIG. 1) and a second end of transmission line 101 (e.g., the left-hand side in the plane of the page of FIG. 1) is electrically connected to signal electronics (e.g., readout lines for the processor, not shown in FIG. 1). Readout electronics may be in an exterior environment, at a different temperature than the operating temperature of the device. Cascade element 100 comprises two inductances 102 and 103, each providing an inductance $L(\Phi_x)$. Inductances 102 and 103 may be realized with an array of SQUIDs and activation lines, as described in more details in FIG. 2 and FIG. 3.

Cascade element 100 also comprises capacitances 104 and 105, in parallel with inductances 102 and 103, respectively. Each of capacitances 104 and 105 can be a parasitic capacitance caused by construction elements of cascade elements 100, such as, for example, by the Josephson junction(s) of a SQUID in the array of SQUIDs, signal lines, etc.

Cascade element 100 also comprises a matching capacitor 106 providing a matching capacitance C.

FIG. 2 is a schematic diagram of an example implementation of a single cascade element 200 according to the present systems, methods and apparatus. Cascade element 200 may be used as one of a plurality of cascade of elements as part of a broadband switch for dynamically isolating a device, such as a superconducting processor.

Cascade element 200 comprises a transmission line 201. A first end of transmission line 201 (e.g., the right-hand side in the plane of the page of FIG. 2) is electrically connected to a device (e.g., a superconducting processor, not shown in FIG. 2) and a second end of transmission line 201 (e.g., the left-hand side in the plane of the page of FIG. 2) is electrically connected to signal electronics (e.g., readout lines, not shown in FIG. 2). Readout electronics may be in an exterior environment, at a different temperature than the operating temperature of the device. Readout electronics may be in an exterior environment, at a different temperature than the operating temperature of the device.

Cascade element 200 comprises a first segment 202 and a second segment 203, where first segment 202 is on the left-hand side of a matching capacitor 204 in the plane of the drawing sheet of FIG. 2, and second segment 203 is on the right-hand side of matching capacitor 204 in the plane of the drawing sheet of FIG. 2. First segment 202 comprises a number N of DC-SQUIDs 205a_1 through 205a_n (collectively 205a) in series, and second segment 203 comprises a number M of DC-SQUIDs 205b_1 through 205b_m (collectively 205b) in series. In at least one implementation, the number of DC-SQUIDs 205a is equal to the number of DC-SQUIDs 205b. In some implementations, cascade element 200 may comprise RF-SQUIDS.

Each DC-SQUID 205a and 205b comprises a pair Josephson junctions 206a and 206b (collectively 206, only one pair called out to reduce clutter). Each Josephson junction of the pair of Josephson junctions 206 has a respective critical current $I_c$. Each DC-SQUID 205a and 205b is inductively coupled by inductance 207a_1 through 207a_n (collectively 207a, only one called out in FIG. 2 to reduce clutter) and 207b_1 through 207b_m (collectively 207b, only one called out in FIG. 2 to reduce clutter), respectively, to activation line loops 208a_1 through 208a_n (collectively 208a) and 208b_1 through 208b_m (collectively 208b), respectively.

Loops 208a are electrically coupled to activation line 209, and loops 208b are electrically coupled to activation line 210. Activation lines 209 and 210 are operable to cause the state of cascade element 200 to change from a suppression state to a passing state, and vice versa, when used as part of a broadband switch for dynamic isolation of a device, such as a superconducting processor.

Cascade element 200 is symmetric with respect to matching capacitor 204. Inductance 207a and 207b are approximately the same for DC-SQUIDs 205a and 205b, respectively, and junctions 206 have approximately the same critical current $I_c$ for DC_SQUIDs 205a and 205b. In some implementations, small variations during building and assembly may lead to values of inductance 207a and 207b and of critical current $I_c$ that are not identical for each DC-SQUID of DC-SQUIDs 205a and 205b.

Cascade element 200 can provide the same total inductance $L(\Phi_x)$ and matching capacitance C as cascade element 100 of FIG. 1.

FIG. 3 is a schematic diagram of an example implementation of a transmission line layout 300 according to the present systems, methods and apparatus. Transmission line layout 300 may be used for dynamically isolating a device, such as a superconducting processor. Transmission line 300 comprises a broadband switch 301 with a number N of cascade elements 302_1 through 302_n (collectively 302) electrically coupled in series.

Each cascade element 302 may be implemented as cascade element 200 of FIG. 2 or cascade element 100 of FIG. 1. It is understood by those skilled in the art that transmission line layout 300 may be of different construction, and the description of FIG. 3 is specific to one implementation. In particular, the number of cascade elements (N) in broadband switch 301 may be different from the number of DC-SQUIDs 205a and 205b.

Transmission line 300 comprises transmission lines 303, 304 and 305. Transmission line 305 passes through each cascade element 302. A first end of transmission lines 303, 304 and 305 (e.g., the right-hand sides in the plane of the drawing sheet of FIG. 3) is electrically connected to a device (e.g., a superconducting processor, not shown in FIG. 3), and a second end of transmission lines 303, 304 and 305 (e.g., the left-hand sides) is electrically connected to signal electronics (e.g., readout lines, not shown in FIG. 3).

Transmission lines 303, 304, and 305 may comprise vias 306 and 307 to connect to ground. Vias 306 and 307 can cause transmission lines 303, 304 and 305 to stay at approximately the same electrical potential during an operation cycle of the device.

Each cascade element 302 in broadband switch 301 is electrically connected by lines 308_1 through 308_n (collectively 308) to transmission line 304 to ground.

Broadband switch 301 comprises activation lines 309 and 310 and inductances 309_a and 310_a that are operable to cause the state of each cascade element 302 to change from a suppression state to a passing state, and vice versa. Activation lines 309 and 310 are electrically coupled to cascade elements 302_1 and 302_n, respectively. In at least one implementation, activation lines 309 and 310 are poor electrical conductors over the frequency range used for transmitting electrical signal to the device, and receiving electric signals from the device (e.g., 4 GHz-8 GHz), for example activation lines 309 and 310 can provide ≥4kΩ impedance at 4 GHz. In the passing phase, broadband switch 301 allows the transmission of signals, and, in the suppression phase, broadband switch 301 suppresses blackbody radiation. In one implementation, activation lines 309 and 310 may be implemented as a low-frequency twisted pair. Line 311 and inductances 311_a through 311_n electrically couple successive cascade elements 302 (e.g., cascade element 302_1 to cascade element 302_2) to provide high impedance to photons, thus at least partially obstructing a pathway to the device.

When broadband switch 301 is implemented with cascade elements such as cascade elements 200 of FIG. 2, activation line 309 corresponds to activation line 209 for cascade element 302_1, and line 311 to activation line 210. Similarly, line 311 corresponds to activation line 209, and activation line 310 to activation line 210 for cascade element 302_n.

In at least one implementation, filtering elements may be integrated into activation lines 309 and 310 to at least limit the introduction of noise while allowing broadband switch 301 to operate at a desired operating speed. For example, passive filtering elements or inductive chokes can be used. In addition, filtering elements may be made of superconducting material or elements, such as kinetic inductors. Examples of kinetic inductors are discussed in detail in International Patent Publication No. WO2017192733A2.

In one implementation, broadband switch 301 may be used as part of a superconducting circuit comprising microwave paths, as described in U.S. Patent Application No. 62/672,392.

Figure 4:
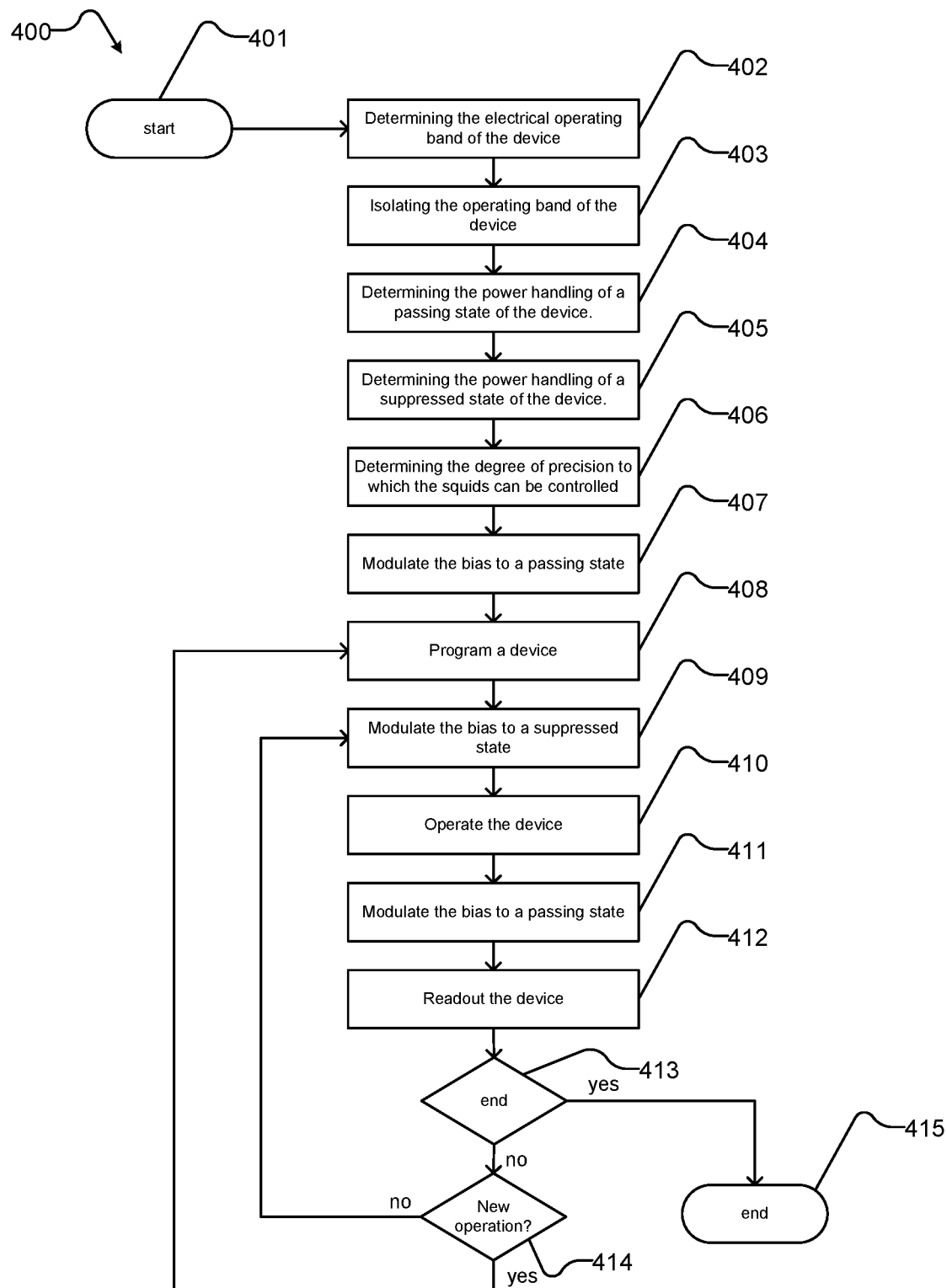
FIG. 4 is a flow chart of an example method for dynamically isolating a device using a switch as described in FIGS. 1 through 3.

FIG. 4 shows an example method 400 for dynamically isolating a device using a broadband switch with an array of N cascade elements, each comprising two arrays of SQUIDs and a matching capacitor, as described in FIGS. 1-3. Method 400 may be used to dynamically isolate a device, including digital and analog superconducting processors. Method 400 may be used to dynamically isolate a quantum processor, such as adiabatic quantum processor or a gate-model quantum processor. In at least one implementation, the broadband switch and the device may operate at cryogenic temperatures. A control system, external to the device, may be used to provide control of a system implementing method 400. The control system can be a non-superconducting processor. The control system can be a digital processor.

Method 400 comprises acts 401 to 415; however, a person skilled in the art will understand that the number of acts is an example and, in some implementations, certain acts may be omitted, further acts may be added, and/or the order of the acts may be changed.

Method 400 may be employed when first assembling and/or calibrating a superconducting processor, and/or at a subsequent time.

Method 400 starts at 401, for example in response to a call from another routine.

At 402, the electrical operating band of the device (e.g., the bandwidth of the signals on the transmission line to the device) is determined. When the device is a superconducting processor, such as a quantum processor, the electrical operating band of processor is determined. In one implementation, the electrical operating band may be the operating band of microwave control signals.

At 403, the operating band of the device is isolated. In one implementation, analog passive components can be employed to isolate the operating band. For example, passive components may be of the form of a combination of discrete and continuous filters, including powder filters, lossy transmission lines, and/or attenuators.

At 404, the power handling of the passing state of the device is determined. During the passing state, the signal needs to be transmitted through the broadband switch without distortion, as described above. The power handling of the passing state determines the SQUIDs $I_c$ design, as $$I_c \propto \sqrt{\frac{P_s}{Z_0}},$$

where $Z_0$ is the characteristic impedance of a transmission line and $P_s$ the signal power. In one implementation, $Z_{10}$ might be 50Ω.

At 405, the power handling of the suppressed state of the device is determined. The power handling of the suppressed state set the degree to which the SQUIDs can be suppressed so that a minimum value of $I_c$ can be used. It is advantageous to use a low value of $I_c$ to decrease radiated or dissipated energy at the SQUIDs that could cause heating of the device operating temperature and introduce further noise. When a flux bias $\Phi$ is applied to a SQUID the current $I_c$ decreases to a value $I_c^*$ and $P_n \propto I_c^{*2} Z_0$, where $P_n$ is the noise power to be suppressed.

At 406, the degree of precision with which the SQUIDs flux bias $\Phi$ can be controlled is determined. This determines how close to the flux bias required for suppression the SQUIDs can be biased without over-biasing and therefore going past the desired operating point. In a broadband switch, such as broadband switch 301 of FIG. 3, flux-biasing a SQUID lowers the resonance frequency of the Josephson junction. While it is important to bias the broadband switch so that the resonance frequency is above the maximum operating frequency (e.g., 8 GHz), increasing the flux bias will lower the junction frequency below the operating frequency, thus narrowing the band available for the programming and readout portion of the operation cycle of the superconducting processor. It is desirable to implement the switch to be broadband while suppressing the desired signals.

Acts 402 through 406 may be implemented once when a device and its system electronics are assembled and/or calibrated and at every successive calibration, when needed. Acts 402 through 406 determine how to program the parameters of a dynamic broadband switch, such as broadband switch 301 of FIG. 3, built with a number $N_1$ of cascade elements in series, where each cascade elements comprises $N_2$ DC_SQUIDs in a first segment, a matching capacitor, $N_3$ DC_SQUIDs in a second segment, and flux bias lines to actuate the switch. In some implementations $N_2$ is not equal $N_3$. In some implementations, filtering elements may be integrated into the bias lines.

In some implementations, the broadband switch is cooled to the operating temperature of the device (e.g., cryogenic temperatures).

Acts 407 through 415 may be implemented as part of a device operation cycle.

At 407, a flux bias is applied to the activation lines of the broadband switch to activate the broadband switch to a passing state. In the passing state, the broadband switch allows signals in a desired operating band to pass through to the device without distortion, corruption and/or reflection.

At 408, the device is programmed. External or room-temperature electronics may send a signal along transmission lines to the device.

At 409, a flux bias is applied to the activation lines of the broadband switch to activate the broadband switch to a suppression state. In the suppression state, the broadband switch suppresses or limits noise in the desired operating bandwidth.

At 410, the device performs the calculation portion of an operating cycle. Given that the broadband switch was set to a suppression state at 409, the device will be in an environment with limited noise and therefore errors to the calculations of the device will be reduced.

At 411, a flux bias is applied to the activation lines of the broadband switch to activate the broadband switch to a passing state as described above with reference to act 407.

At 412, the device is read out. Given that the broadband switch was set to a passing state at 409, the readout bandwidth is not suppressed.

At 413, a control system determines whether method 400 has ended. If not control passes to 414, otherwise to 415.

At 414, a control system determines whether a new operation needs to be programmed into the device. If not, control passes to 409 where the broadband switch is set to a suppressed state and the same calculation performed at act 410 is repeated. Otherwise a new operation needs to be programmed into the device before a calculation is performed and control passes to 408. A person skilled in the art would have noticed that the broadband switch was already set to a passing state to enable readout at 411 and therefore a new operation may be programmed into the device without modifying the state of the broadband switch.

At 415, method 400 ends until, for example, it is invoked again.

In one implementation, method 400 may be invoked as part of a routine for addressing devices in superconducting circuits, as described in U.S. Patent Application No. 62/679,079.

Figure 5:
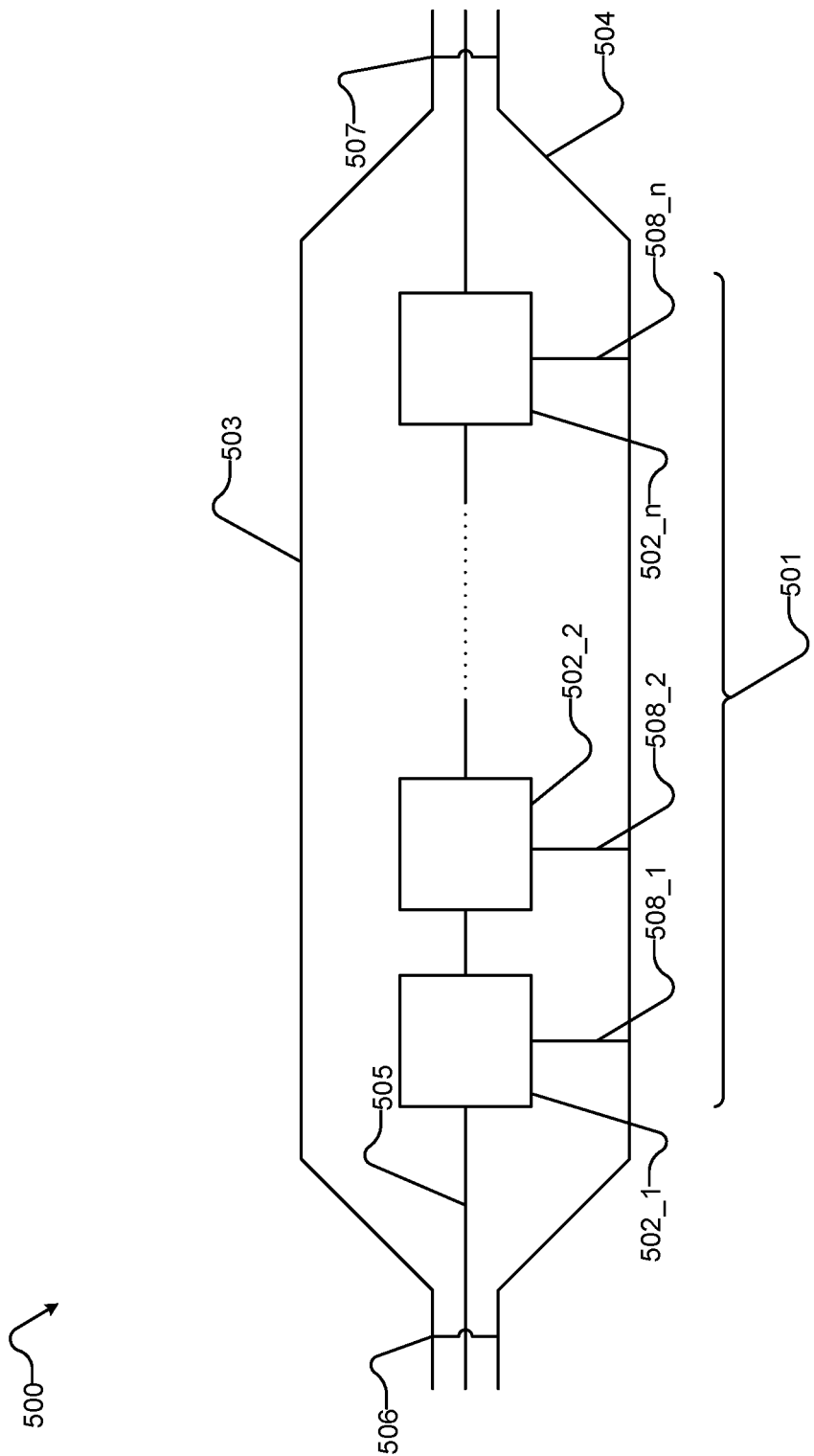
FIG. 5 is a schematic diagram of an example implementation of a transmission line layout including a low-pass filter according to the present disclosure.

FIG. 5 is a schematic diagram of an example implementation of a transmission line layout 500 according to the present systems, methods and apparatus. Transmission line layout 500 may be used for suppressing high frequency radiations from a superconducting device, such as a superconducting processor. Transmission line layout 500 comprises a superconducting low-pass lumped-elements filter 501 with a number N of cascade elements 502_1 through 502_n (collectively, 502) electrically coupled in series. Filter 501 may be used to at least partially isolate a superconducting device from the external environment.

Transmission line layout 500 comprises transmission lines 503, 504 and 505. Transmission line 505 passes through each cascade element 502. A first end of transmission lines 503, 504 and 505 (e.g., the right-hand sides in the plane of the drawing sheet of FIG. 5) is electrically connected to a device (e.g., a superconducting processor, not shown in FIG. 5), and a second end of transmission lines 503, 504 and 505 (e.g., the left-hand sides) is electrically connected to signal electronics (e.g., readout lines, not shown in FIG. 5). Transmission line layout 500 may be in a cryogenic environment.

Transmission lines 503, 504, and 505 may comprise vias 506 and 507 to connect to ground. Vias 506 and 507 can cause transmission lines 503, 504 and 505 to stay at approximately the same electrical potential during an operation cycle of the device.

Each cascade element 502 in filter 501 is electrically connected by lines 508_1 through 508_n (collectively 508) to transmission line 504 to ground.

Each cascade element 502 may be implemented as a superconductor with a magnetic or kinetic inductance and with a capacitance formed using superconducting electrodes and a crystalline or amorphous dielectric. Superconductors are lossless and hence filter 501 reduces heat and radiation that may be a source of noise to a superconducting device such as a superconducting processor.

In some implementations, each cascade element 502 may be implemented as cascade element 200 of FIG. 2 or cascade element 100 of FIG. 1. Alternatively, broadband switch 301 may be used unbiased as filter 501, therefore providing no switching capabilities. The use of broadband switch 301 under zero bias condition as filter 501 provides non-tunable low-pass filtering capabilities to at least partially reduce the noise level at superconducting device.

It is understood by those skilled in the art that transmission line layout 500 may be of different construction, and the description of FIG. 5 is specific to one implementation. In particular, the number of cascade elements (N) in filter 501 may be different from the number of DC-SQUIDs 205a and 205b.

Figure 6A:
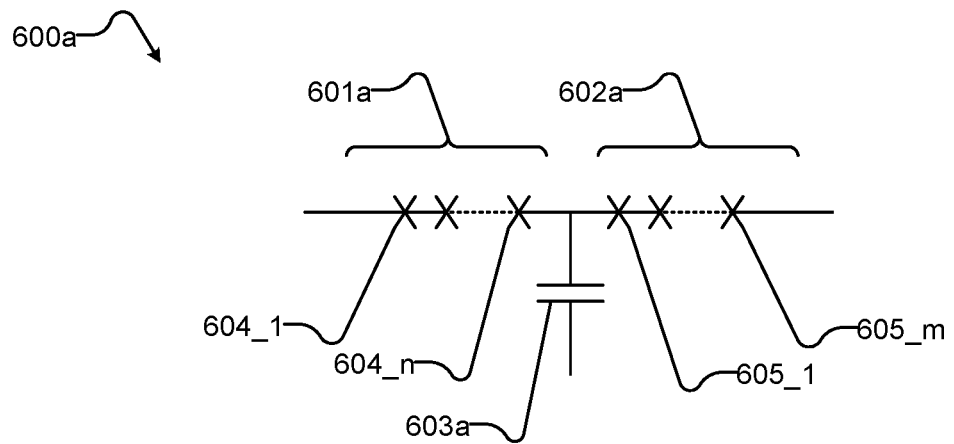
FIG. 6A is a schematic diagram of an example implementation of a cascade element with Josephson junctions.

FIG. 6A is a schematic diagram of an example implementation of a cascade element 600a. Cascade element 600a may be used to implement cascade elements 502 of FIG. 5.

Cascade element 600a comprises a first segment 601a and a second segment 602a, where first segment 601a is on the left-hand side of a matching capacitor 603a in the plane of the drawing sheet of FIG. 6A, and second segment 602a is on the right-hand side of matching capacitor 603a in the plane of the drawing sheet of FIG. 6A.

First segment 601a comprises a number N of Josephson junctions 604_1 through 604_n (collectively, 604) in series, and a second segment 602a comprises a number M of Josephson junctions 605_1 through 605_m (collectively, 605) in series, providing the inductance described above with reference to cascade element 502 of FIG. 2. In at least one implementation, the number N of Josephson junctions 604 is equal to the number M of Josephson junctions 605. Cascade element 600a is symmetric with respect to matching capacitor 603a. Josephson junctions 604 and 605 can be very compact and at least partially reduce cross-talk effects.

Figure 6B:
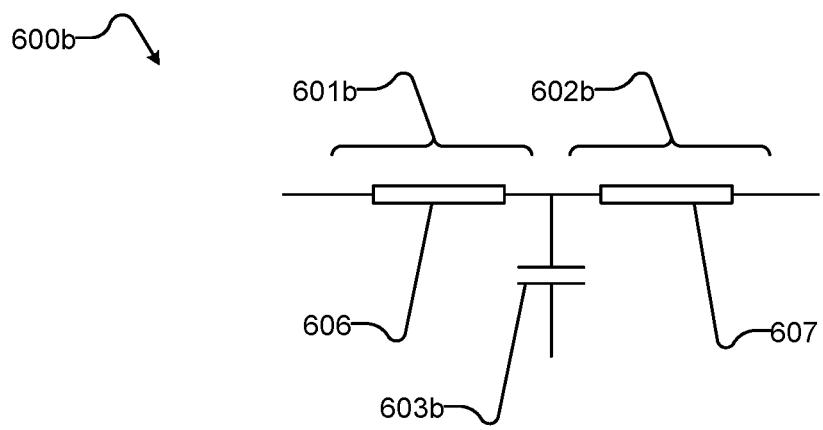
FIG. 6B is a schematic diagram of an example implementation of a cascade element with kinetic inductance materials.

FIG. 6B is a schematic diagram of an example implementation of a cascade elements 600b. Cascade element 600b may be used to implement cascade elements 502 of FIG. 5.

Cascade element 600b comprises a first segment 601b and a second segment 602b, where first segment 601b is on the left-hand side of a matching capacitor 603b in the plane of the drawing sheet of FIG. 6B, and second segment 602b is on the right-hand side of matching capacitor 603b in the plane of the drawing sheet of FIG. 6B.

First segment 601b comprises a first kinetic inductance material 606 and second segment 602b comprises a second kinetic inductance material 607, providing the inductance as describe above with reference to cascade element 502 of FIG. 5. In at least one implementation, first kinetic inductance material 606 and second kinetic inductance material 607 are the same. First and second kinetic inductance materials 606 and 607 may be a material with a large kinetic inductance fraction, such as, for example, TiN, NbN, NbTiN or Al. First and second kinetic inductance materials 606 and 607 have a higher saturation power than Josephson junctions 604 and 605 of cascade element 600a.

Figure 6C:
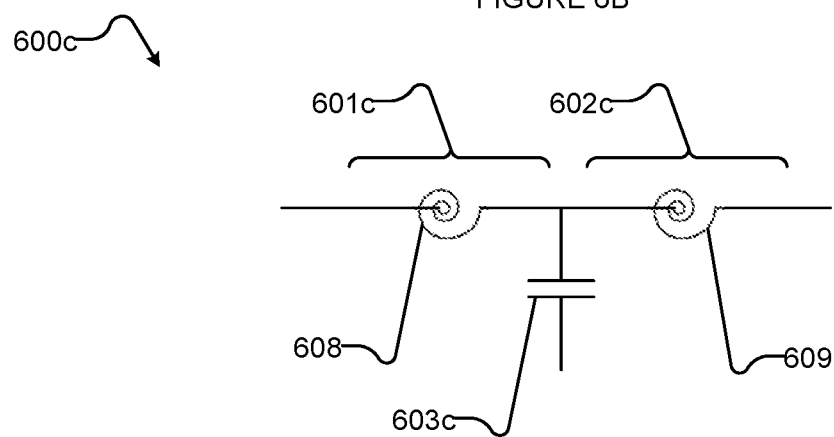
FIG. 6C is a schematic diagram of an example implementation of a cascade element with superconducting magnetic spiral inductors.

FIG. 6C is a schematic diagram of an example implementation of a cascade elements 600c. Cascade element 600c may be used to implement cascade elements 502 of FIG. 5.

Cascade element 600c comprises a first segment 601c and a second segment 602c, where first segment 601c is on the left-hand side of a matching capacitor 603c in the plane of the drawing sheet of FIG. 6C, and second segment 602c is on the right-hand side of matching capacitor 603c in the plane of the drawing sheet of FIG. 6C.

First segment 601c comprises a first superconducting magnetic spiral inductor 608 and second segment 602c comprises a second superconducting magnetic spiral inductor 609, providing the inductance as described above with reference to cascade element 502 of FIG. 5. In at least one implementation, first and second inductors 608 and 609 provide the same inductance.

Figure 7:
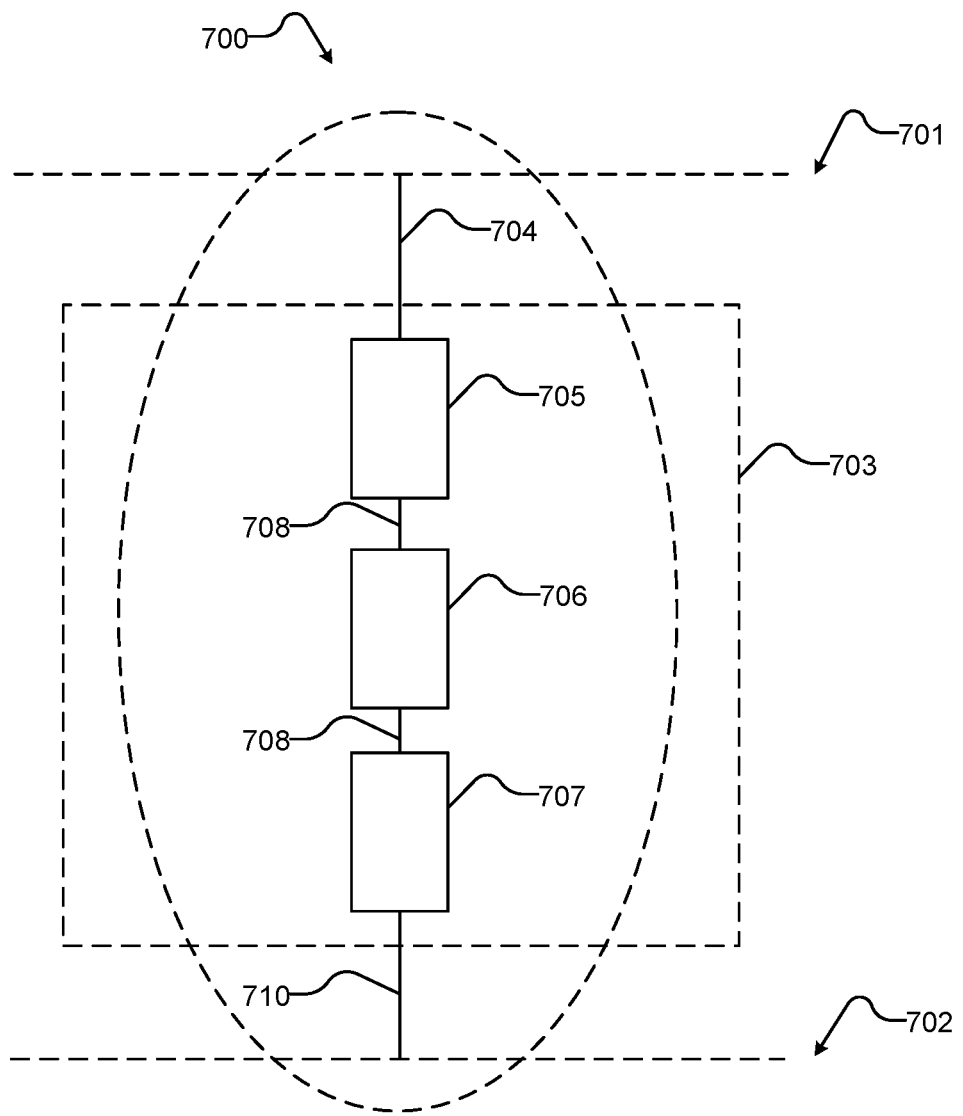
FIG. 7 is a schematic diagram illustrating an example implementation of a microwave path to a superconducting circuit including a switch, according to the present disclosure.

FIG. 7 is a schematic diagram illustrating an example implementation of a microwave path 700 to a superconducting circuit including a switch, according to the present disclosure.

Microwave path 700 is positioned in a cryogenic refrigeration system, and travels between a still 701 and a sample holder 702. The cryogenic refrigeration system includes still 701, sample holder 702, and mixing chamber 703. Microwave path 700 is a microwave path through the cryogenic refrigeration system. Still 701, sample holder 702, and mixing chamber 703 are shown as dashed lines in FIG. 7 to provide context for microwave path 700.

Sample holder 702 can contain or hold the superconducting circuit. In some implementations, the superconducting circuit is an integrated superconducting circuit. In some implementations, the integrated superconducting circuit includes a quantum processor. In some implementations, the quantum processor includes a plurality of superconducting flux qubits. See, for example, PCT Patent Publication No. WO2010028183A2.

Microwave path 700 traverses mixing chamber 703. Microwave path 700 includes a superconducting coaxial cable 704 between still 701 and mixing chamber 703. In some implementations, superconducting cable 704 is superconducting NbTi coaxial cable.

Microwave path 700 includes a bandpass filter 705, a powder filter 706, and a switch 707 for the operating band. In some implementations, powder filter 706 is a superconducting powder filter. Bandpass filter 705 is communicatively coupled to powder filter 706 by coaxial cable 708. In some implementations, bandpass filter 705 is a GHz bandpass filter with greater than 90 dB out-of-band suppression of frequencies below 60 GHz. Bandpass filter 705 and powder filter 706 in combination can determine at least in part the filtering of signals on microwave path 700. The use of one or both of bandpass filter 705 and powder filter 706 can be optional in some implementations. One reason for including filters is to reduce noise on high-bandwidth lines used for programming devices such as devices in a quantum processor.

In some implementations operating at cryogenic temperatures, switch 707 is a broadband switch such as broadband switch 301 of FIG. 3.

In some implementations, coaxial cable 708 is a copper coaxial cable. Powder filter 706 is communicatively coupled to switch 707 by coaxial cable 709. In some implementations, coaxial cable 709 is a copper coaxial cable. Switch 707 is communicatively coupled to sample holder 702 by coaxial cable 710. In some implementations, coaxial cable 710 is a copper coaxial cable. Other implementations of microwave paths to superconducting circuits are described in U.S. Patent Application No. 62/679,079.

Figure 8:
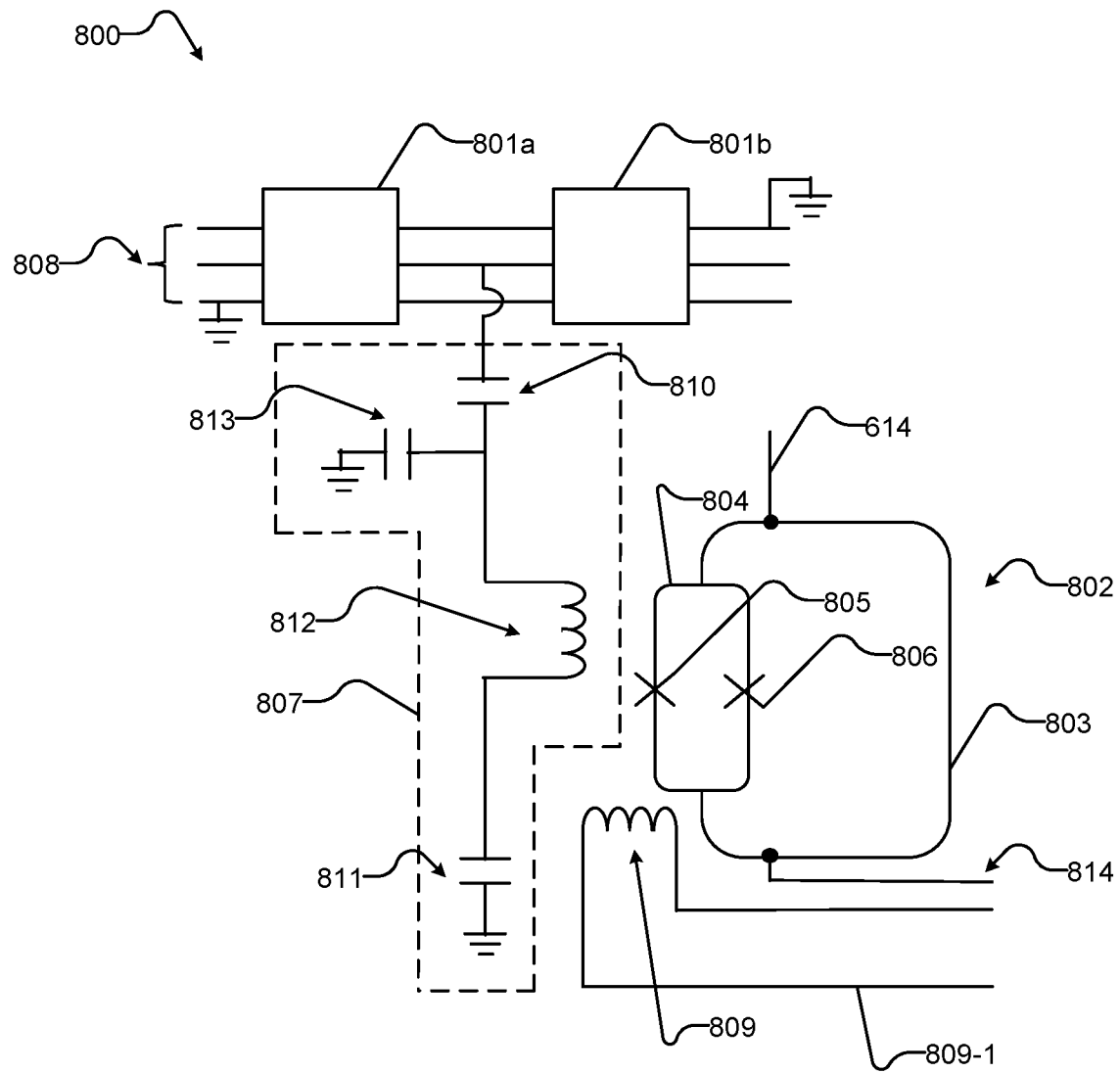
FIG. 8 is a schematic diagram illustrating an example implementation of a superconducting circuit that includes a switch, according to the present disclosure.

FIG. 8 is a schematic diagram illustrating an example implementation of a superconducting circuit 800 that includes a first broadband switch 801a, according to the present disclosure. In some implementations, a second broadband switch 801b may be employed together with first broadband switch 801a.

First and second broadband switches 801a and 801b may be implemented as broadband switch 301 of FIG. 3 and may be used as part of a superconducting circuit to address a device. Superconducting circuit 800 includes a resonator addressed DAC 802.

In superconducting circuit 800, resonator-addressed DAC 802 includes a loop 803 of material that is superconductive in a range of temperatures, and a CJJ 804. CJJ 804 includes two parallel current paths each interrupted by a Josephson junction, Josephson junctions 805 and 806, respectively.

Superconducting circuit 800 further includes a resonator 807, a transmission line 808, and interface 809 operable to provide a global flux bias by a global flux bias line 809-1. Resonator 807 includes coupling capacitors 810 and 811, an inductive interface 812 to resonator-addressed DAC 802, and an optional shunting capacitor 813. The term "inductive interface" is also referred to in the present application as a coupling inductance. Coupling inductance 812, for example, inductively communicatively couples resonator 807 and resonator-addressed DAC 802.

Instead of capacitively communicatively coupling resonator 807 to transmission line 808 by coupling capacitor 810, resonator 807 can be communicatively coupled to transmission line 808 by an inductive coupling. For example, resonator 807 can be inductively communicatively coupled to transmission line 808 by an inductive coupling to a portion of the body of resonator 807.

Superconducting circuit 800 further includes a current bias line 814 operable to provide a current bias to resonator-addressed DAC 802. Other implementations of superconducting circuits are described in U.S. Patent Application No. 62/679,079.

In order to exhibit coherent dynamics, qubits are generally engineered to be strongly decoupled from their environment. However, in some implementations, it might be desirable for qubits to be strongly coupled to a cold dissipative environment. For example, strongly coupling qubits to a cold dissipative source facilitates initializing qubits to their lowest energy eigenstates quickly. Coupling to a high-energy dissipative environment can allow for the preparation of a mixed state, including the lowest energy eigenstate and one or more additional excited states. It can thus be useful to be able to continuously tune qubits coupling to a thermal bath.

An additional application where it may be desirable to couple qubits to a tunable thermal bath is a hybrid thermal-quantum annealing process and/or a hybrid thermal-quantum reverse annealing process. During a quantum annealing process, the evolution of a quantum processor is generally controlled by tuning the transverse field or some other general driver Hamiltonian, while the thermal temperature remains constant. Introducing a continuously variable coupling to a thermal bath with variable temperature over a large dynamic allows to control the evolution of a quantum processor by annealing from a higher to a lower thermal temperature.

It may also be useful to calibrate a quantum processor at a different electromagnetic temperature than the ambient phonon temperature to study spin-bath effects or other noise effect that are dependent on the phonon bath.

Figure 9:
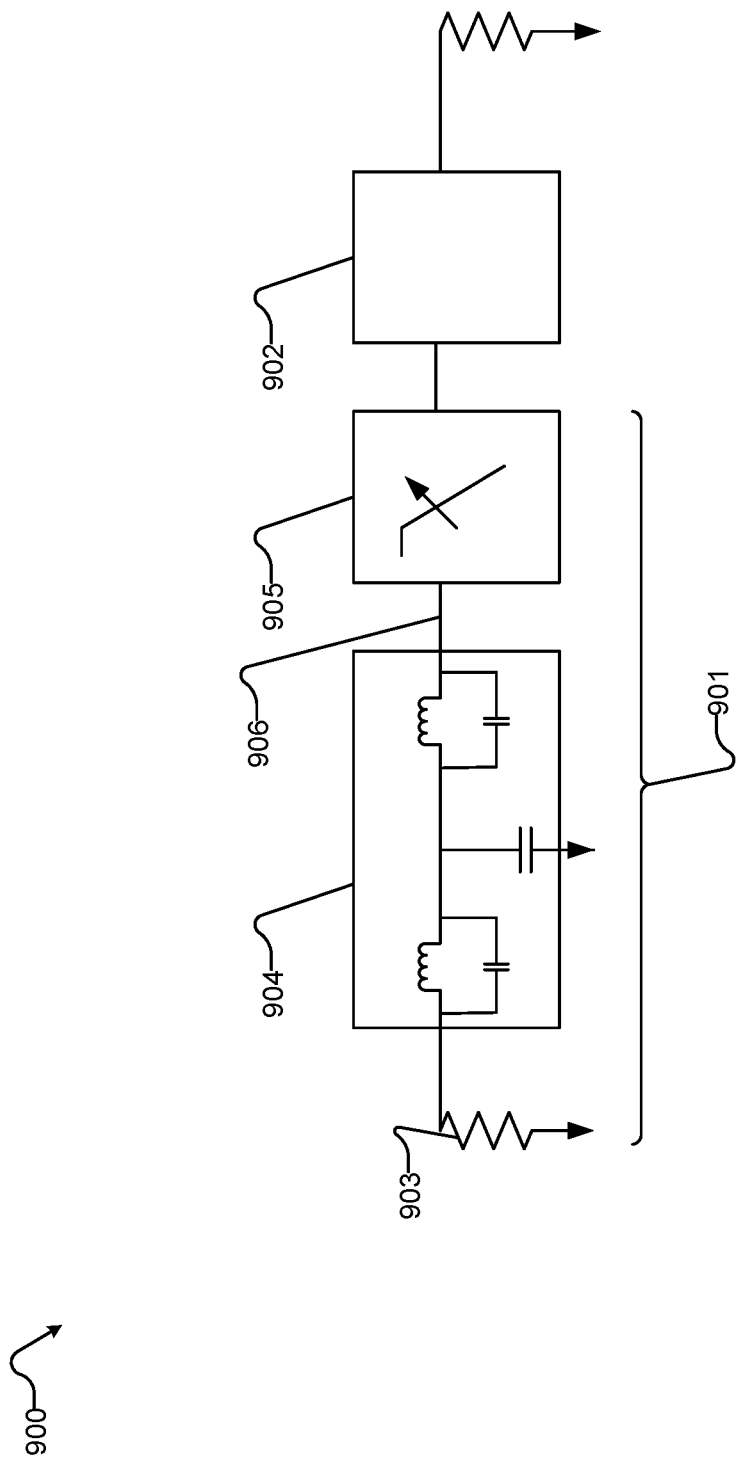
FIG. 9 is a schematic diagram illustrating an example implementation of a processor that includes a tunable thermal bath, according to the present disclosure.

FIG. 9 is a schematic diagram illustrating an example implementation of a system 900 that includes a tunable thermal bath 901, according to the present disclosure.

Tunable thermal bath 901 may be used to continuously provide time-dependent coupling to a dissipation source. System 900 also comprises a superconducting circuit, for example a quantum processor 902. Quantum processor 902 may comprise a plurality of superconducting qubits.

Tunable thermal bath 901 comprises a variable temperature resistor 903, a broadband switch 904 and an electrical filter 905. Broadband switch 904 may be implemented as broadband switch 301 of FIG. 3. Filter 905 may be omitted in some implementations. Filter 905 may be implemented as a tunable or fixed frequency low-pass or high-pass/band-pass filer. In some implementations, filter 905 may be implemented as broadband switch 301 of FIG. 3. The temperature of resistor 903 will set the flux and cutoff frequency of the blackbody radiation bathing the processor. Broadband switch 904 can act as a dimmer switch, tuning the power impinging on processor 902. Filter 905 can be used to further adjust the spectrum of the radiation seen by processor 902, independent from the blackbody source temperature.

Resistor 903, broadband switch 904 and filter 905 can be electrically coupled in series to a transmission line 906 that is controllably coupled to quantum processor 902. The qubits of quantum processor 902 may be coupled to transmission line 906 via a fixed coupling—for example a fixed capacitance—or a tunable coupling—for example a tunable magnetic coupling or a resonator. The coupling of the qubits in quantum processor 902 is not shown in FIG. 9 to reduce complexity.

Resistor 903 may be cooled below the operating temperature of quantum processor 902 using, for example a SINIS refrigerator.

In some implementations, system 900 may comprise a plurality of tunable thermal baths (not shown in FIG. 9), each tunable thermal bath electrically coupled to a different subset of the qubits in processor 902. Each tunable thermal bath may be tuned to a respective bath temperature, thus each subset of qubits may be coupled to a different bath temperature.

Figure 10:
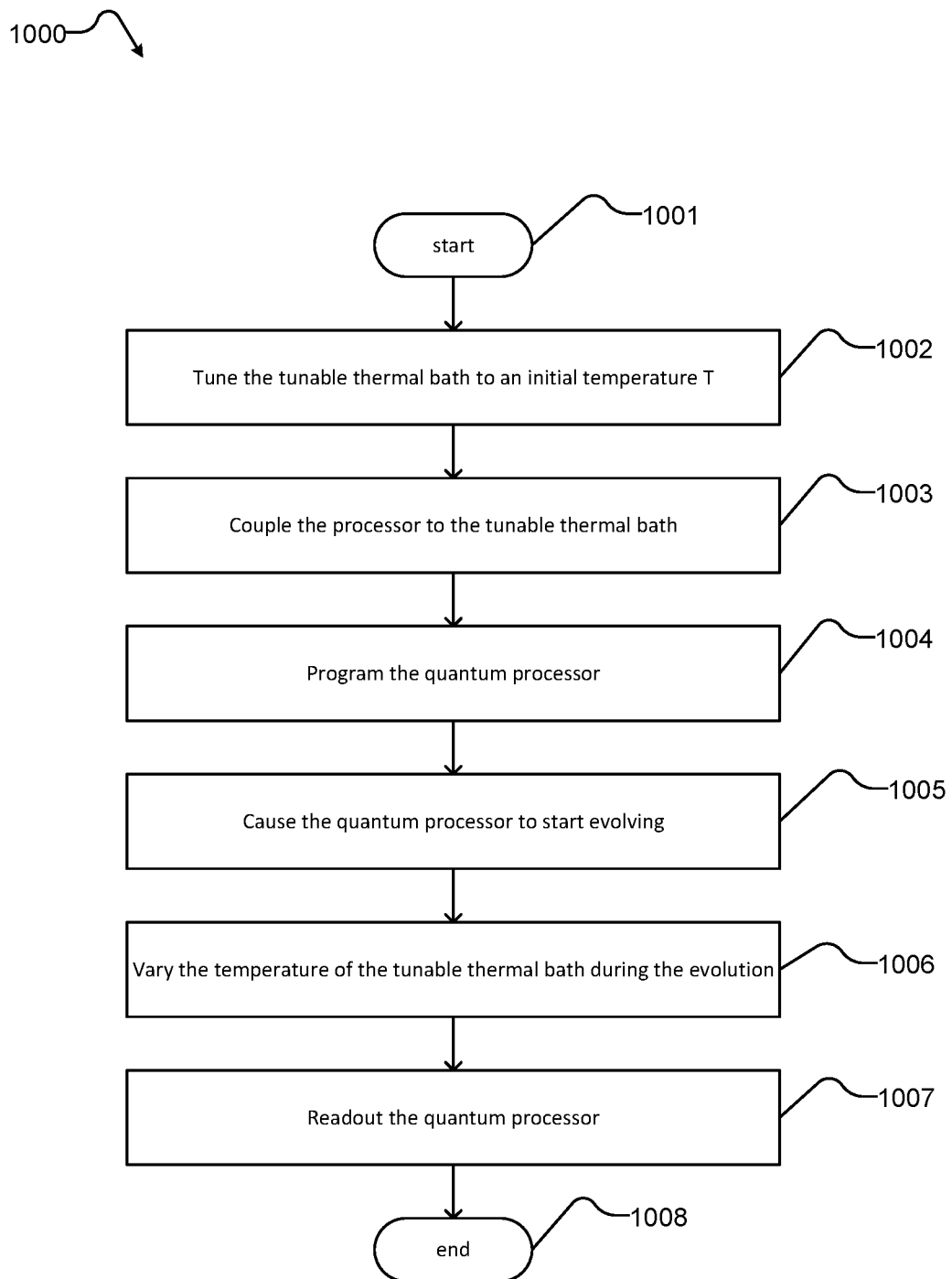
FIG. 10 is a flow chart of an example method for hybrid thermal-quantum annealing with a quantum processor coupled to a thermal bath, according to the present disclosure.

FIG. 10 is a flow chart of an example method 1000 for hybrid thermal-quantum annealing with a quantum processor coupled to a thermal bath, according to the present disclosure. Method 1000 may be used with system 900 and will be described with reference to FIG. 9.

Method 1000 comprises acts 1001 to 1008; however, a person skilled in the art will understand that the number of acts is an example and, in some implementations, certain acts may be omitted, further acts may be added, and/or the order of the acts may be changed.

Method 1000 starts at 1001, for example in response to a call from another routine.

At 1002, tunable thermal bath 901 is tuned to an initial temperature T, for example the operational or cryogenic temperature of quantum processor 902. In some implementations, tunable thermal bath 901 may be set at a temperature lower that the operational or cryogenic temperature of quantum processor 902 with a SINIS refrigerator.

At 1003, quantum processor 902 is strongly coupled to thermal bath 901. In the disclosure and the appended claims, the term 'strongly coupled' means coupled so as to intentionally change the inherent coherence properties of the qubits. Broadband switch 904 may be set to a passing state, as described with reference to broadband switch 301 of FIG. 3, and/or filter 905 may be tuned to allow the desired frequency to pass substantially undisturbed to quantum processor 902.

At 1004, quantum processor 902 is programmed with a problem Hamiltonian.

At 1005, quantum processor 902 starts evolving. In some implementations, quantum processor 902 may be caused to evolve backwards.

At 1006, the initial temperature T of tunable thermal bath 901 is modified. Modifying the temperature during the anneal process facilitates driving the evolution of quantum processor 902. If quantum processor 902 evolves backwards, the temperature is increased, otherwise decreased. A person skilled in the art will recognized that the temperature T may be varied in different way depending on the desired annealing schedule for the problem Hamiltonian set at 1004. In particular, the temperature T can decrease (or increase) with a certain speed and/or remain constant, thus pausing the anneal, for a dwell time, before increasing (or decreasing). Examples of different annealing schedules are described in more details in International Patent Publication No. WO2017075246A1.

At 1007, quantum processor is readout.

At 1008, method 1000 terminates, until it is for example, invoked again.

Figure 11:
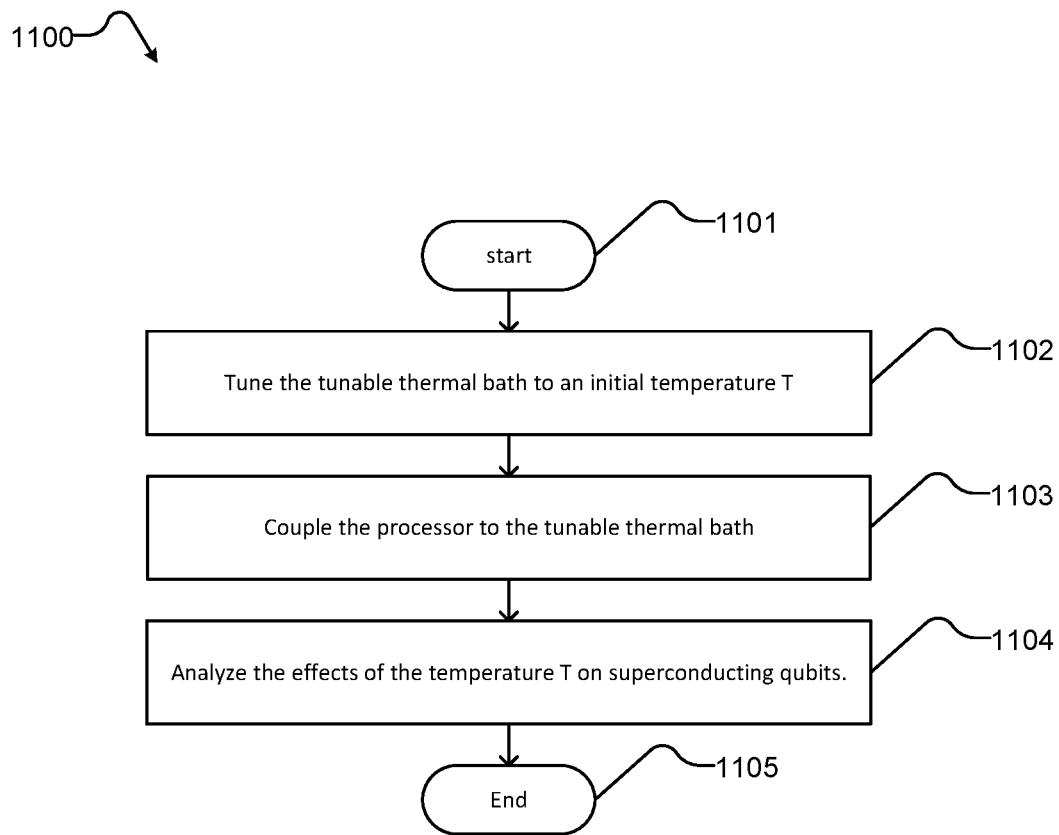
FIG. 11 is a flow chart of an example method for calibrating a processor coupled to a thermal bath.

FIG. 11 is a flow chart of an example method 1100 for calibrating a processor system. The processor system comprises a processor coupled to a thermal bath, for example a quantum processor. Method 1100 may be employed as part of a routine calibration procedure or anytime that a processor is subject to any change that may have modified the behavior of any part of the processor. Method 1100 is described with reference to system 900.

Method 1100 comprises acts 1101 to 1105; however, a person skilled in the art will understand that the number of acts is an example, and, in some implementations, certain acts may be omitted, further acts may be added, and/or the order of the acts may be changed.

Method 1100 starts at 1101, for example in response to a call from another routine.

At 1102, tunable thermal bath 901 is tuned to a temperature T. Temperature T may be the cryogenic or operational temperature of processor 902. In some implementations, temperature T may be the phonon temperature of processor 902. In some implementations, temperature T is supplied at 1101 as an input to method 1100.

At 1103, processor 902 is strongly coupled to tunable thermal bath 901, so that qubits in processor 902 are at least in part decoupled from the ambient phonons.

At 1104, the effect of temperature T on the qubits of processor 902 is analyzed. Due to the strong coupling of processor 902 to tunable thermal bath 901, effects that are dependent on phonon temperature may be studied, for example spin-bath effect.

At 1105, method 1100 terminates, until it is, for example, invoked again.

Figure 12:
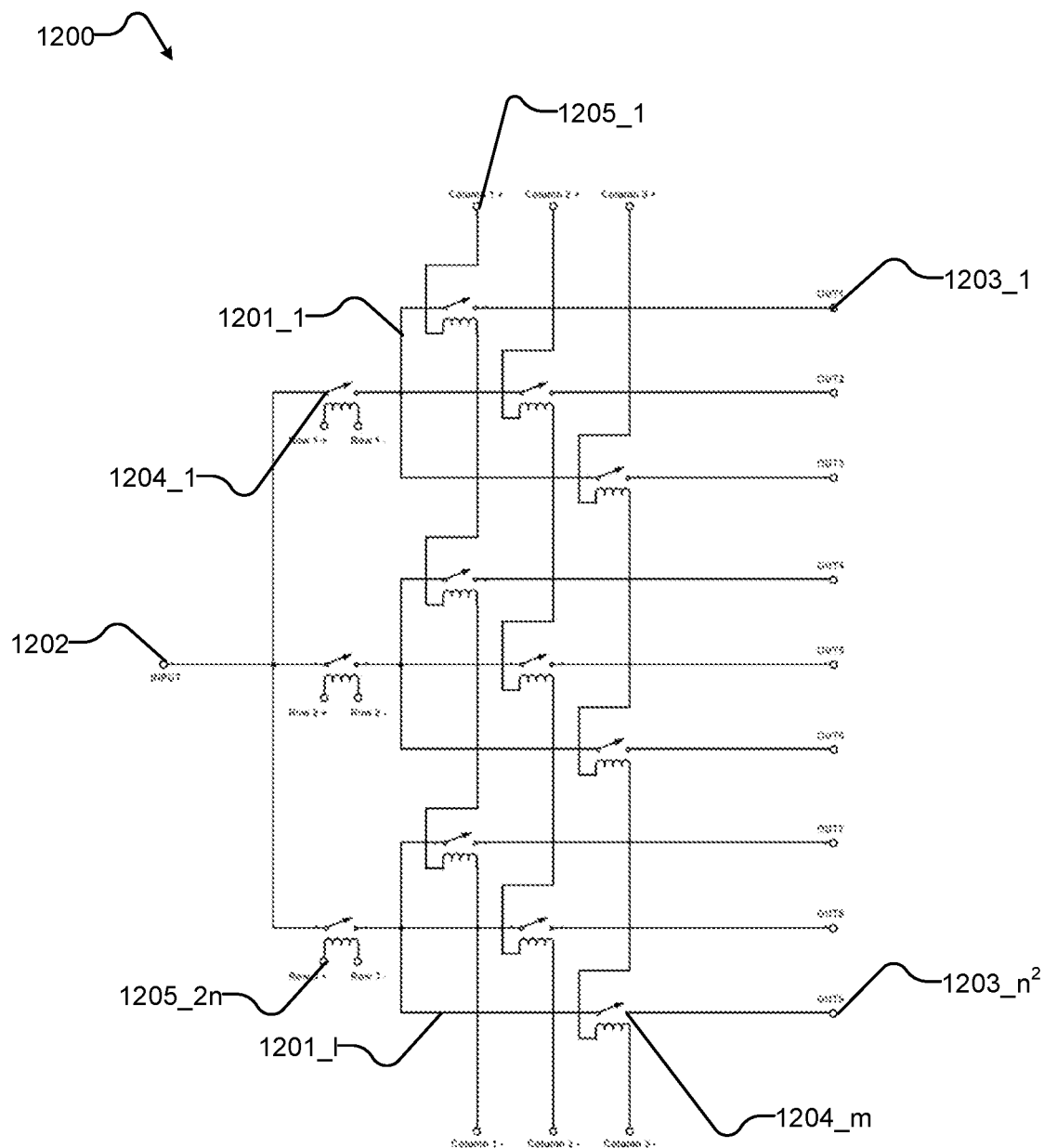
FIG. 12 is schematic diagram illustrating an example implementation of a multiplexer microwave circuit with broadband switches, according to the present disclosure.

FIG. 12 is schematic diagram illustrating an example implementation of a multiplexer microwave circuit 1200 comprising broadband switches, according to the present disclosure. Microwave circuit 1200 may be used to drive independent broadband signals to multiple devices using a single microwave line.

Microwave circuit 1200 is positioned in a cryogenic environment and comprises a number L of microwave paths 1201_1 through 1201_1 (collectively, 1201) that travel between an input 1202 and a number $N^2$ of outputs 1203_1 through 1203_$n^2$ (collectively, 1203). Outputs 1203 are connected to multiple devices, for example the devices of a superconducting circuit (not shown in FIG. 12). In some implementations, the superconducting circuit may be a superconducting quantum processor.

Microwave circuit 1200 comprises a number M of switches 1204_1 through 1204_$m$ (collectively, 1204) positioned in a X-Y addressing scheme, so that each microwave path 1201 comprises two switches 1204. Microwave circuit 1200 comprises 2N of addressing lines 1205_1 through 1205_$2n$ (collectively, 1205) controlling $N^2$ outputs 1203. Two switches 1204 need to be activated, via two addressing lines 1205, to send a signal along one of the path 1201. In the example implementation of FIG. 12, N=3.

In some implementations, switches 1204 may be implemented as broadband switch 301 of FIG. 3. In an example use case, when one microwave path 1201 is used, requiring two switches 1204 to be set to a passing state, all other switches 1204 are set to a suppressing mode to reduce heating and reduce electromagnetic contamination to surrounding electronics.

Figure 13:
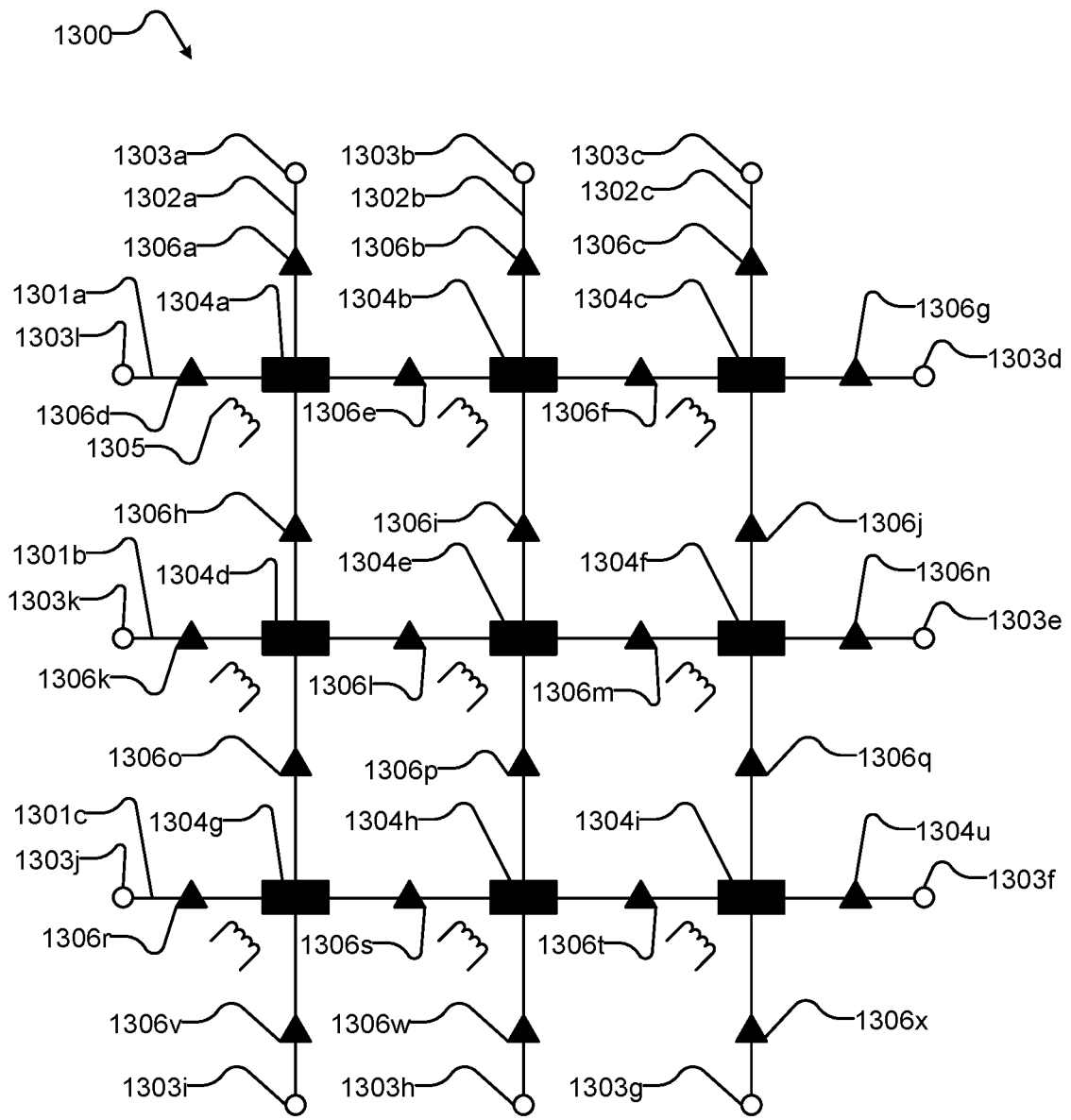
FIG. 13 is a schematic diagram of a circuit comprising microwave elements and broadband switches.

FIG. 13 is a schematic diagram of a circuit 1300 comprising microwave elements and broadband switches. On a processor, for example a quantum processor, it is desirable to route electrical signals through various components (e.g., microwave elements or devices). Microwave devices can be programmatically connected and disconnected from each other using mechanical switches or tunable resonators. However, mechanical switches may cause heating to occur between switching operations, thus rendering them less desirable in cryogenic environments or in environments that need to maintain a constant temperature. The use of mechanical switches in cryogenic environments may also cause frost to form between mechanical contacts, reducing the efficiency of the mechanical switches. Additionally, mechanical wear and tear may be a concern when prolonged use of a mechanical switch is desired or in an environment where it is not practical to provide frequent maintenance, including temperature-controlled environments. Another concern regarding the use of mechanical switches for routing signals through the components of a processor is that mechanical switches occupy large volumes and, therefore, are not well suited to scale up and provide switching capabilities between thousands of interconnected devices. Tunable resonators offer an advantage on scalability, compared to mechanical switches, but are limited in the frequency ranges they can support. Therefore, the use of a broadband switch, for example broadband switch 301 of FIG. 3 is desirable.

Circuit 1300 is a generalized arrangement of switches and microware devices for use in a processor, for example a quantum processor. Circuit 1300 constitutes a reconfigurable microwave network, comprising a variety of devices. Circuit 1300 comprises a first plurality of arms 1301$a$ though 1301$c$ (collectively, 1301) running horizontally with respect to the plane of the page of FIG. 13, and a second plurality of arms 1302$a$ through 1301$c$ (collectively, 1302) running vertically with respect to the plane of the page of FIG. 13. Each of arms 1301 and 1302 has a first end and a second end, opposite the first end.

Circuit 1300 comprises a plurality of connection points 1303$a$ through 1303l (collectively, 1303), each connection point 1303 at either the first or the second end of first plurality of arms 1301 or at either the first or the second end of second plurality of arms 1302, so that each arm 1301 and each arm 1302 has exactly one connection point 1303 at the first end and another one of connection point 1303 at the second end. In FIG. 13, circuit 1300 is shown as having three arms 1301 and three arms 1302, however, a person skilled in the art will understand that the number of arms 1301 and 1302 in circuit 1300 is an example and a larger or smaller number of arms 1301 or 1302 is possible. Connection points 1303 provide communicative coupling between the components of circuit 1300 and various components of a processor, for example a quantum processor (not shown in FIG. 13).

Each arm 1301 crosses or meets each of the arms 1302. Circuit 1300 comprises a plurality of broadband switches 1304$a$ through 1304$i$ (collectively, 1304), each broadband switch 1304 located at a crossing region between one of the arms 1301 and one of the arms 1302. Circuit 1300 is shown in FIG. 13 as having nine broadband switches 1304, however, in a different implementation, 1300 may have a different number of broadband switches 1304. Broadband switches 1304 may be implemented as broadband switch 301 of FIG. 3. Each broadband switch 1304 is proximate a flux bias 1305 (only one called out in FIG. 13 to reduce clutter), each flux bias able to operate one of broadband switches 1304.

Circuit 1300 also comprises a plurality of components 1306$a$ through 1306$x$ (collectively, 1306), each component 1306 along one of the arms 1301 or 1302 and electrically connected to two broadband switches 1304 or to one broadband switch 1304 and one connection point 1303. Circuit 1300 is shown in FIG. 13 as having twenty-four components 1306, however, in another implementation circuit 1300 may have a different number of components 1306. Components 1306 may represent a variety of electrical or microwave components in different implementations of circuit 1300. In one implementation, components 1306 may be electrical wires, so that a first group of connection points 1303 (e.g. connection points 1303 on the left-hand side of the page of FIG. 13) may be used as input for electrical signals, a second group of connection points 1303 (e.g. connection points 1303 on the right-hand side of the page of FIG. 13) may be used as outputs and a sub-group of flux biases 1305 (e.g. flux biases proximate broadband switches 1304 on arm 1302$c$) are actuated. In this implementation, circuit 1300 is used as a superconducting, non-dissipative, time-division multiplexer.

In another implementation, components 1306 are resistive elements, so that circuit 1300 is used as a multi-channel variable attenuator.

In another implementation, components 1306 are bandpass filters. In this implementation, an input signal will have the amplitudes of various frequency components adjusted and recombined to produce a different signal, therefore, circuit 1300 is used as an arbitrary configurable broadband bandpass filter.

Circuit 1300 can take advantage of interference effects by splitting an electrical signal along two different paths with different phase delays and then recombining the electrical signal.

In another implementation, a first subset of components 1306 are active microwave components (e.g. amplifiers) while a second subset of components 1306 are passive microwave components and circuits 1300 is used as reconfigurable analog computational element, similar to a Field Programmable Analog Array (FPAA).

The above described method(s), process(es), or technique (s) could be implemented by a series of processor readable instructions stored on one or more nontransitory processor-readable media. Some examples of the above described method(s), process(es), or technique(s) method are performed in part by a specialized device such as an adiabatic quantum computer or a quantum annealer or a system to program or otherwise control operation of an adiabatic quantum computer or a quantum annealer, for instance a computer that includes at least one digital processor. The above described method(s), process(es), or technique(s) may include various acts, though those of skill in the art will appreciate that in alternative examples certain acts may be omitted and/or additional acts may be added. Those of skill in the art will appreciate that the illustrated order of the acts is shown for example purposes only and may change in alternative examples. Some of the example acts or operations of the above described method(s), process(es), or technique(s) are performed iteratively. Some acts of the above described method(s), process(es), or technique(s) can be performed during each iteration, after a plurality of iterations, or at the end of all the iterations.

The above description of illustrated implementations, including what is described in the Abstract, is not intended to be exhaustive or to limit the implementations to the precise forms disclosed. Although specific implementations of and examples are described herein for illustrative purposes, various equivalent modifications can be made without departing from the spirit and scope of the disclosure, as will be recognized by those skilled in the relevant art. The teachings provided herein of the various implementations can be applied to other methods of quantum computation, not necessarily the example methods for quantum computation generally described above.

The various implementations described above can be combined to provide further implementations. All of the commonly assigned US patent application publications, US patent applications, foreign patents, and foreign patent applications referred to in this specification and/or listed in the Application Data Sheet are incorporated herein by reference, in their entirety, including but not limited to U.S. Pat. No. 6,627,916, U.S. Patent Application No. 62/672,392, U.S. Patent Application No. 62/778,643, U.S. Patent Application No. 62/680,824, International Patent Publication No. WO2017192733A2, PCT Patent Publication No. WO2010028183A2, U.S. Pat. No. 9,727,823, U.S. Patent Publication No US20170178018A1, International Patent Publication No. WO2017075246A1, and U.S. Patent Application No. 62/679,079.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A configurable microwave network comprising:
   a first plurality of arms, each arm of the first plurality of arms extending substantially parallel to other arms of the first plurality of arms;
   a second plurality of microwaves lines, each arm of the second plurality of arms extending substantially parallel to other arms of the second plurality of arms, and each crossing and electrically coupling to the first plurality of arms, wherein each arm of the first and the second pluralities of arms comprises first and second ends;
   a plurality of connections comprising: a first set of connections located at the first ends of the first and the second plurality of arms, a second set of connections located at the second ends of the first and the second plurality of arms, and a third set of connections each located at a crossing of one arm of the first plurality of arms and one arm of the second plurality of arms;
   a plurality of broadband switches, each broadband switch of the plurality of broadband switches located at a connection of the third set of connections, wherein each broadband switch is a Superconducting Quantum Interference Device (SQUID)-based switch; and,
   a plurality of circuit components, each circuit component of the plurality of circuit components interrupts a respective arm of one of the first and the second pluralities of arms at a location between two connections of the plurality of connections.

2. The configurable microwave network of claim 1 further comprising a plurality of flux bias sources, wherein each flux bias source is communicatively coupled to a respective broadband switch, and each flux bias source is operable to transmit a bias signal to set a respective broadband switch to a passing state or a suppressed state.

3. The configurable microwave network of claim 1, wherein each broadband switch of the plurality of broadband switches comprises:
   a plurality of cascade elements superconductingly electrically coupled in series;
   a first activation line having a first line inductance, the first activation line communicatively coupled to at least a first cascade element of the plurality of cascade elements; and,
   a second activation line having a second line inductance, the second activation line communicatively coupled to at least a final cascade element of the plurality of cascade elements, wherein each of the first and the second activation lines are operable to transmit a signal operable to set a cascade element to a passing state or a suppressed state.

4. The configurable microwave network of claim 3, wherein each cascade element of the plurality of cascade elements comprises:
   a first plurality of SQUIDs superconductingly electrically coupled in series;
   a second plurality of SQUIDs superconductingly electrically coupled in series to one another and to the first plurality of SQUIDs, each SQUID of the first and the second pluralities of SQUIDs comprising a superconducting loop and at least one Josephson Junction; and
a matching capacitor positioned between the first and the second pluralities of SQUIDs.

5. The configurable microwave network of claim 1, wherein each arm of the first plurality of arms and the second plurality of arms is a microwave line.

6. The configurable microwave network of claim 1, wherein the plurality of circuit components comprises a plurality of microwave components.

7. The configurable microwave network of claim 1, wherein at least two connections of the first set of connections are communicatively coupled to input signals to the configurable microwave network, at least one connection of the first set of connections are communicatively coupled to output signals from the configurable microwave network, each circuit component of the plurality of circuit components comprises an electrical wire, and broadband switches of the plurality of broadband switches are selectively actuatable to perform time-division multiplexing.

8. The configurable microwave network of claim 1, wherein each circuit component of the plurality of circuit components comprise one of:
resistances, wherein broadband switches of the plurality of broadband switches are selectively actuatable to perform multi-channel variable signal attenuation; or,
band-pass filters, wherein broadband switches of the plurality of broadband switches are selectively actuatable to perform broadband bandpass filtering.

9. The configurable microwave network of claim 8, wherein the plurality of devices are devices located in a superconducting quantum processor.

10. The configurable microwave network of claim 1, wherein the plurality of circuit components comprises a set of active microwave components and a set of passive microwave components, wherein broadband switches of the plurality of broadband switches are selectively actuatable to perform analog computation.

11. The configurable microwave network of claim 1, wherein connections of the first set of connections and of the second set of connections are communicatively coupled to respective devices of a plurality of devices.

12. A method of operation of a configurable microwave network, the configurable microwave network comprising: a first plurality of arms, each arm of the first plurality of arms extending substantially parallel to one another; a second plurality of microwaves lines, each arm of the second plurality of arms extending substantially parallel to one another, and crossing and electrically coupled to the first plurality of arms, each arm of the first and the second pluralities of arms comprising first and second ends; a plurality of connections comprising: a first set of connections located at the first ends of the first and the second plurality of arms, at least a subset of the first set of connections being communicatively coupled to circuit inputs, a second set of connections located at the second ends of the first and the second plurality of arms, at least a subset of the second set of connections being communicatively coupled to circuit outputs, and a third set of connections each located at a crossing of one arm of the first plurality of arms and one arm of the second plurality of arms; a plurality of broadband switches, each located at a connection of the third set of connections and each being a Superconducting Quantum Interference Device (SQUID)-based switch; and, a plurality of circuit components, each circuit component of the plurality of circuit components interrupting a respective arm of one of the first and the second pluralities of arms at a location between two connections, the method comprising:
configuring at least one signal path across the configurable microwave network between one of the circuit inputs and one of the circuit outputs based on actuation of one or more broadband switches, each signal path comprising at least one of: at least one arm of the first plurality of arms and at least one arm of the second plurality of arms; and,
transmitting a signal to at least one of the circuit inputs, the signal travelling across one of the one or more signal paths to at least one of the circuit outputs.

13. The method of claim 12, wherein configuring at least one signal path across the configurable microwave network between one of the circuit inputs and one of the circuit outputs based on actuation of one or more broadband switches comprises one or more of:
selectively setting a state of at least one broadband switch of the one or more broadband switches to a passing state that enables transmission of the signal therethrough; and
selectively setting a state of at least one broadband switch of the one or more broadband switches to a suppression state that prevents transmission of the signal therethrough.

14. The method of claim 12, wherein the configurable microwave network comprises a plurality of flux bias sources, each flux bias source is communicatively coupled to a respective broadband switch, and wherein configuring at least one signal path across the configurable microwave network between one of the circuit inputs and one of the circuit outputs based on actuation of one or more broadband switches comprises:
applying a flux bias signal via a respective flux bias source to each one of the one or more broadband switches to set a respective state of each one of the one or more broadband switches to a passing state or a suppressed state.

15. The method of claim 14, wherein each broadband switch of the plurality of broadband switches comprises: a plurality of cascade elements superconductingly electrically coupled in series, each of the cascade elements including a plurality of SQUIDs superconductively electrically coupled in series having an inductive interface; and at least one activation line communicatively coupled to at least one SQUID of the plurality of SQUIDs of at least one cascade element, wherein applying a flux bias signal via a respective flux bias source to each one of the one or more broadband switches comprises:
applying the respective flux bias signal to each of the at least one activation line; and,
transmitting the respective flux bias signal to the at least one SQUID via the inductive interface to modulate an impedance value of a respective one of the one or more broadband switches.

16. The method of claim 12, wherein each circuit component of the plurality of circuit components comprises an electrical wire, and wherein:
configuring at least one signal path across the configurable microwave network between one of the circuit inputs and one of the circuit outputs based on actuation of one or more broadband switches comprises: configuring a plurality of multiplexer signal channels based on states of the one or more broadband switches, each multiplexer signal channel being a signal path across at least one electrical wire; and, transmitting a signal to at least one circuit input, the signal travelling across one of the one or more signal paths to at least one circuit output comprises: transmitting input signals to circuit inputs associated with particular ones of the plurality of multiplexer signal channels, and, at the circuit output, an output signal is a time-divided composite of the input signals.

17. The method of claim 12, wherein the circuit components of the plurality of circuit components comprise resistances;
- configuring at least one signal path across the configurable microwave network between one of the circuit inputs and one of the circuit outputs based on actuation of one or more broadband switches comprises: configuring a plurality of signal channels based on states of the one or more broadband switches, each signal channel being a signal path across at least one resistance and having a respective attenuation coefficient; and,
- transmitting a signal to at least one circuit input, the signal travelling across one of the one or more signal paths to at least one circuit output comprises: transmitting the signal to a circuit input associated with a particular one of the plurality of signal channels, and, at the circuit output, the signal is attenuated based on a corresponding attenuation coefficient.

18. The method of claim 12, wherein the circuit components of the plurality of circuit components comprise bandpass filters;
- configuring at least one signal path across the configurable microwave network between one of the circuit inputs and one of the circuit outputs based on actuation of one or more broadband switches comprises: configuring a plurality of signal paths based on states of the one or more broadband switches, each signal path including at least one bandpass filter; and,
- transmitting a signal to at least one circuit input, the signal travelling across one of the one or more signal paths to at least one circuit output comprises: transmitting a signal with an initial set of frequency components to a circuit input associated with a particular one of the plurality of signal paths, and, at the circuit output, the signal having amplitudes of frequency components that differ from amplitudes of the initial set of frequency components.

19. The method of claim 12, wherein the plurality of circuit components comprises a set of active microwave components and a set of passive microwave components;
- configuring at least one signal path across the configurable microwave network between one of the circuit inputs and one of the circuit outputs based on actuation of one or more broadband switches comprises: configuring, based on states of the one or more broadband switches, a plurality of signal paths to perform configured analog computations, each signal path including one or more of: at least one active microwave component of the set of active microwave components and at least one passive microwave component of a set of passive microwave components; and,
- transmitting a signal to at least one circuit input, the signal travelling across one of the one or more signal paths to at least one circuit output comprises: transmitting a signal to a circuit input associated a particular one of the plurality of signal paths, and, at the circuit output, the signal having undergone a respective analog computation of the particular one of the plurality of signal paths.

20. The method of claim 12, wherein each of the circuit outputs is communicatively coupled to a respective one of a plurality of devices in a superconducting quantum processor, and wherein transmitting a signal to at least one of the circuit inputs includes applying the signal to a circuit input that causes transmission of the signal to one of the devices of the superconducting quantum processor via a respective one of the circuit outputs.

\* \* \* \* \*